(12) United States Patent
Finkelstein et al.

(10) Patent No.: US 8,188,563 B2
(45) Date of Patent: May 29, 2012

(54) SHALLOW-TRENCH-ISOLATION (STI)-BOUNDED SINGLE-PHOTON CMOS PHOTODETECTOR

(75) Inventors: Hod Finkelstein, San Diego, CA (US); Sadik C. Esener, Solana Beach, CA (US)

(73) Assignee: The Regents of the University of California, Oakland, CA (US)

( * ) Notice: Subject to any disclaimer, the term of this patent is extended or adjusted under 35 U.S.C. 154(b) by 331 days.

(21) Appl. No.: 12/374,641

(22) PCT Filed: Jul. 21, 2007

(86) PCT No.: PCT/US2007/074057
§ 371 (c)(1),
(2), (4) Date: Feb. 4, 2009

(87) PCT Pub. No.: WO2008/011617
PCT Pub. Date: Jan. 24, 2008

(65) Prior Publication Data
US 2009/0315135 A1 Dec. 24, 2009

Related U.S. Application Data

(60) Provisional application No. 60/832,327, filed on Jul. 21, 2006.

(51) Int. Cl.
*H01L 29/66* (2006.01)
(52) U.S. Cl. .. 257/481; 257/438; 257/605; 257/E29.335
(58) Field of Classification Search .................. 257/186, 257/438, 481, 603, 605, 606, E29.335, E29.355, 257/E29.357, E31.063, E31.064, E31.116
See application file for complete search history.

(56) References Cited

U.S. PATENT DOCUMENTS

| | | | |
|---|---|---|---|
| 4,945,227 A | 7/1990 | Jones et al. | |
| 6,384,663 B2* | 5/2002 | Cova et al. | 327/514 |
| 6,943,051 B2* | 9/2005 | Augusto et al. | 438/58 |
| 7,262,402 B2* | 8/2007 | Niclass et al. | 250/214.1 |
| 7,683,308 B2* | 3/2010 | Charbon et al. | 250/214 R |
| 7,714,292 B2* | 5/2010 | Agarwal et al. | 250/370.01 |
| 7,759,650 B2* | 7/2010 | Heringa et al. | 250/370.11 |
| 2001/0020673 A1* | 9/2001 | Zappa et al. | 250/214 R |
| 2001/0020863 A1* | 9/2001 | Cova et al. | 327/514 |
| 2003/0165207 A1 | 9/2003 | Noguchi et al. | |
| 2003/0197242 A1* | 10/2003 | Chen et al. | 257/509 |
| 2004/0106265 A1 | 6/2004 | Vickers | |
| 2005/0012033 A1* | 1/2005 | Stern et al. | 250/214 R |
| 2005/0045956 A1* | 3/2005 | Chen et al. | 257/355 |

(Continued)

FOREIGN PATENT DOCUMENTS
WO WO 2007/127607 11/2007
(Continued)

OTHER PUBLICATIONS

Akil, N. et al., "Photon generation by silicon diodes in avalanche breakdown," Appl. Phys. Lett. vol. 73, No. 7, pp. 871-872 (Aug. 17, 1998).

(Continued)

*Primary Examiner* — Matthew Landau
*Assistant Examiner* — Joseph C Nicely
(74) *Attorney, Agent, or Firm* — Perkins Coie LLP

(57) ABSTRACT

Techniques and apparatus for using single photon avalanche diode (SPAD) devices in various applications.

42 Claims, 20 Drawing Sheets

U.S. PATENT DOCUMENTS

| | | | |
|---|---|---|---|
| 2005/0127473 A1* | 6/2005 | Sakagami | 257/510 |
| 2005/0255649 A1 | 11/2005 | Augusto et al. | |
| 2006/0131480 A1 | 6/2006 | Charbon et al. | |
| 2006/0169978 A1* | 8/2006 | Tatani et al. | 257/53 |
| 2006/0192086 A1* | 8/2006 | Niclass et al. | 250/214.1 |
| 2006/0202297 A1* | 9/2006 | Ishimura | 257/436 |
| 2006/0208306 A1* | 9/2006 | Peng et al. | 257/315 |
| 2006/0231742 A1* | 10/2006 | Forsyth | 250/214 R |
| 2007/0096236 A1* | 5/2007 | Yagyu et al. | 257/438 |
| 2007/0182949 A1* | 8/2007 | Niclass | 356/3 |
| 2008/0098337 A1* | 4/2008 | Perez et al. | 716/4 |
| 2008/0128631 A1 | 6/2008 | Suhami | |
| 2009/0065704 A1 | 3/2009 | Heringa et al. | |
| 2009/0121306 A1* | 5/2009 | Ishikawa | 257/438 |
| 2010/0102384 A1* | 4/2010 | Kim et al. | 257/330 |
| 2010/0127160 A1* | 5/2010 | Niclass et al. | 250/214 DC |

FOREIGN PATENT DOCUMENTS

WO     WO 2008/011617     1/2008

OTHER PUBLICATIONS

Albota, M.A. et al., "Three-dimensional imaging laser radars with Geiger-mode avalanche photodiode arrays," Lincoln Laboratory Journal 13(2): 351-370 (2002).

Alon, E. et al., "Circuits and Techniques for High-Resolution Measurement of On-Chip Power Supply Noise," 2004 Symposium on VLSI Circuits Digest of Technical Papers (IEEE Journal of Solid-State Circuits), vol. 40, No. 4, 2005, pp. 102-105.

Aull, B. F. et al., "Geiger-Mode Avalanche Photodiodes for Three-Dimensional Imaging", Lincoln Laboratory Journal, 13(2): 335-350 (2002).

Becker, W., "High count rate multichannel TCSPC for optical tomography", Proceedings of the SPIE, vol. 4431, pp. 249-254 2001.

Berland, K.M, "Detection of specific DNA sequences using dual-color two-photon fluorescence correlation spectroscopy", Journal of Biotechnology vol. 108, pp. 127-136 (2004).

Bohmer, M. et al., "Time-resolved confocal scanning device for ultrasensitive fluorescence detection," Rev. Sci. Instrum. 72(11): 4145-4152 (Nov. 2001).

Chen, Y. et al., "Dual-color photon-counting histogram" Biophysical Journal, vol. 88, pp. 2177-2192 (2005).

Chynoweth, A.G. and K.G. McKay, "Photon emission from avalanche breakdown in silicon," Physical Review, vol. 12, No. 2, pp. 369-376 (1956).

Cova, S. et al., "High-accuracy picosecond characterization of gain-switched laser diodes," Optics Letters, vol. 14, No. 24, pp. 1341-1343 (1989).

Cova, S. et al., "Avalanche photodiodes and quenching circuits for single-photon detection", Applied Optics, vol. 35, No. 12: pp. 1956-1976 (Apr. 20, 1996).

Cova, S. et al., "Evolution and prospects for single-photon avalanche diodes and quenching circuits", Journal of Modern Optics, vol. 51, No. 9-10, 2004, pp. 1267-1288, (2004).

Finkelstein, H., "STI-bounded single-photon avalanche diode in a deep-submicrometer CMOS technology," IEEE Electron Device Letters, vol. 27, No. 11, pp. 887-889 (2006).

Finkelstein, H. et al., "A compact single-photon avalanche diode in a deep-submicron CMOS technology", Extended Abstracts of the 2006 International Conference of Solid-State Devices and Materials, Sep. 13-15, 2006, Yokohama, Japan, 2006. pp. 862-863, Abstract No. B-9-4.

Haitz, R.H., "Model for the electrical behavior of a microplasma," Journal of Applied Physics, vol. 35, No. 5, pp. 1370-1376 (May 1964).

Haitz, R.H., "Studies on optical coupling between silicon $p$-$n$ junctions," Solid State Electronics, vol. 8, pp. 417-425 (1965).

Heinze, K.G. et al., "Simultaneous two-photon excitation of distinct labels for dual-color fluorescence cross-correlation analysis," Proc. Natl. Acad. Sci. USA, vol. 97, No. 19, pp. 10377-10382, (Sep. 12, 2000).

Hillesheim, L.N. and J. D. Müller, "The Dual-Color Photon Counting Histogram with Non-Ideal Photodetectors," Biophysical Journal vol. 89, pp. 3491-3507 (Nov. 2005).

Hiskett, P.A. et al, "Low-noise single-photon detection at wavelength 1.551 µm," Electronics Letters, vol. 37, No. 17, pp. 1081-1083 (2001).

Hurkx, G. A. M., "A New Recombination Model for Device Simulation Including Tunneling," IEEE Transactions on Electron Devices, vol. 39, No. 2, pp. 331-338 (1992).

International Search Report and Written Opinion, dated Feb. 19, 2008, for PCT/US07/74057, filed on Jul. 21, 2007, published as WO 2008/011617, and entitled: "Shallow-Trench-Isolation (STI)-Bounded Single-Photon CMOS Photodetector". (11 pages).

Kask, P. et al., "Two-dimensional fluorescence intensity distribution analysis: theory and applications," Biophysical Journal, vol. 78, pp. 1703-1713, Apr. 2000.

Kettling, U. et al., "Real-time enzyme kinetics monitored by dual-color fluorescence cross-correlation spectroscopy," Proc. Natl. Acad. Sci. USA, vol. 95, pp. 1416-1420 (1998).

Kim, S.A. et al., "Intracellular calmodulin availability accessed with two-photon cross-correlation," Proc. Natl. Acad. Sci. USA, vol. 101, pp. 105-110 (2004).

Kurtsiefer, C. et al., "The breakdown flash of silicon avalanche photodiodes—back door for eavesdropper attacks?," J. Mod. Optics, vol. 48, No. 13, pp. 2039-2047 (2001).

Lacaita, A. and M. Mastrapasqua, "Strong dependence of time resolution on detector diameter in single proton avalanche diodes," Electronics Letters vol. 26, No. 24, pp. 2053-2054, 1990.

Lee, M.-J.E., et al., "Low-power area-efficient high-speed I/O circuit techniques," IEEE Journal of Solid-State Circuits, vol. 35, Iss. 11, pp. 1591-1599 (2000).

Lin, F. et al., "A protein biosensor using Geiger mode avalanche photodiodes," Journal of Physics: Conference Series 10, pp. 333-336 (2005).

Lu, C.Y. and W.Y. Lee, "Process Integration," Chapter 9 in ULSI Technology, C.Y. Chang and S.M. Sze, Editors, Singapore: The McGraw-Hill Companies, Inc., 1996, pp. 472-529.

McIntyre, R.J., "A new look at impact ionization—part I: A theory of gain, noise, breakdown probability, and frequency response," IEEE Trans. On Electron Devices, vol. 46, No. 8, pp. 1623-1631 (1999).

Mitchell, A.C. et al., "Measurement of nanosecond time-resolved fluorescence with a directly gated interline CCD camera," Journal of Microscopy, vol. 206, Part 3, pp. 233-238, (2002).

Niclass et al., "A CMOS 3D Camera with Millimetric Depth Resolution" IEEE Custom Integrated Circuits Conference (CICC), pp. 705-708, Oct. 2004.).

Niclass, C. et al., "A Single Photon Avalanche Diode Array Fabricated in Deep-Submicron CMOS Technology," Proceedings of the Design, Automation and Test in Europe, 2006. Date '06. Mar. 6-10, 2006, pp. 1-6.

Niclass, C. et al.,"Design and Characterization of a CMOS 3-D Image Sensor Based on Single Photon Avalanche Diodes," IEEE J. of Solid-State Circuits, vol. 40, No. 9, pp. 1847-1854 (Sep. 2005).

Niclass, C. et al., "CMOS imager based on single photon avalanche diodes", IEEE Transducers '05: The 13th International Conference on Solid-State Sensors, Actuators and Microsystems, Seoul, Korea, Jun. 5-9, 2005, pp. 1030-1034, Submission: 2E4.144.

Oldham, W.G. et al., "Triggering Phenomena in Avalanche Diodes," IEEE. Trans. Elect. Devices., vol. ED-19, No. 9, pp. 1056-1060 (1972).

Onsager, L., "Reciprocal Relations in Irreversible Processes. I.," Physical Review 37: 405-426 (1931).

Onsager, L., "Reciprocal Relations in Irreversible Processes. II.," Phys. Rev. 38: 2265-2279 (1931).

Ranjan, K., et al, "Impact of Metal Overhang and Guard Ring techniques on Breakdown voltage of Si strip Sensors", Proceedings of 2003 IEEE Nuclear Science Symposium, 2003. pp. 780-783.

Rech, I. et al., "Photon-timing detector module for single-molecule spectroscopy with 60-ps resolution," IEEE J. Sel. Top. Quantum Electron., vol. 10, No. 4, pp. 788-795 (2004).

Rhodes, H. et al., "CMOS imager technology shrinks and image performance," in Proceedings of 2004 IEEE Workshop on Microelectronics and Electron Devices, Boise, ID., pp. 7-18 (2004).

Rochas, A. et al., "Actively recharged single photon counting avalanche photodiode integrated in an industrial CMOS process," Sensors and Actuators A, vol. 110: 124-129 (2004).

Rochas, A. et al., "Low-Noise Silicon Avalanche Photodiodes Fabricated in Conventional CMOS Technologies", IEEE Transactions on Electron Devices, vol. 49, No. 3, pp. 387-394 (2002).

Rochas, A. et al., "First Passively-Quenched Single Photon Counting Avalanche Photodiode Element Integrated in a Conventional CMOS Process with 32ns Dead Time", Applications of Photonic Technology 5, R.A. Lessard, G. A. Lampropoulos, and G. W. Schinn, Editors, Proceedings of SPIE vol. 4833, pp. 107-115 (2002).

Schwille, P. et al., "Dual-color fluorescence cross-correlation spectroscopy for multicomponent diffusional analysis in solution," Biophysical Journal, vol. 72, pp. 1878-1886 (1997).

Spinelli, A. and A.L. Lacaita, "Physics and Numerical Simulation of Single Photon Avalanche Diodes," IEEE Trans. Electron Devices, vol. 44, No. 11, pp. 1931-1943 (1997).

Sze, S.M. and W. Shockley, "Unit-cube expression for space-charger resistance," The Bell System Technical Journal 46(5): 837-842 (1967).

Sze, S. M., "p-n Junction Diode," Chapter 2 in *Physics of Semiconductor Devices*, 2nd edition, John Wiley & Sons, pp. 63-132 (1981).

Sze, S. M., "Photodetectors," Chapter 13, pp. 743-789, "Appendix H—Properties of Ge, Si and GaAs at 300 K", pp. 850-851, and "Appendix I—Properties of $SiO_2$ and $Si_3N_4$ at 300 K" p. 852 in *Physics of Semiconductor Devices*, 2nd edition, John Wiley & Sons.

Sze, S.M., G. Gibbons, "Effect of junction curvature on breakdown voltage in semiconductor," Solid-State Electronics, vol. 9, pp. 831-845 (1966).

Taylor, D.M. et al., "Characterization of novel active area silicon avalanche photodiodes operating in the Geiger mode," Journal of Modern Optics, vol. 51, No. 9-10, pp. 1323-1332 (2004).

Thews, E. et al., "Cross Talk Free Fluorescence Cross Correlation Spectroscopy in Live Cells," Biophysical Journal vol. 89, Sep. 2005, pp. 2069-2076 (2005).

Tremsin, A.S. et al., "The Microsphere Plate: A New Type of Electron Multiplier," Nuclear Instruments and Methods in Physics Research A, vol. 368, pp. 719-730 (1996).

Voldman, S. et al., "Semiconductor Process and Structural Optimization of Shallow Trench Isolation-Defined and Polysilicon-Bound Source/Drain Diodes for ESD Networks", Proceedings of the Electrical Overstress/Electrostatic Discharge Symposium Proceedings (EOS/ESD Symposium), Reno, Nevada, Oct. 6-8, 1998, pp. 98-151 to 98-160, Session 3A.1.1-3A.1.10 (1998).

Yilmaz, H., "Optimization and surface charge sensitivity of high-voltage blocking structures with shallow junctions", IEEE Trans. Electron Devices, vol. 38, No. 7, pp. 1666-1675 (Jul. 1991).

Zappa, F. et al., "SPADA: Single-Photon Avalanche Diode Arrays," IEEE Photonic Technology Letters, vol. 17, No. 3, pp. 657-659 (2005).

Albota et al., "Photon-counting 1.55 μm optical communications with pulse-position modulation and a multimode upconversion single-photon receiver," IEEE Lasers Electro-Optics Soc., 161-162 (2008).

Annunziata et al., "Superconducting niobium nanowire single photon detectors," presented at Advanced Photon Counting Techniques, Boston, MA (2006).

Becker, "Advanced Time-Correlated Single Photon Counting Techniques, Chapter 6: Detectors for Photon Counting," Berlin, Germany: Springer-Verlag, 213-261 (2005).

Ben-Michael et al,. "Afterpulsing in InGaAs/InP single photon avalanche photodetectors," Digest of the LEOS Summer Topical Meetings, 15-16 (2006).

Bethune et al., "A high-performance integrated single-photon detector for telecom wavelengths," Journal of Modern Optics, 51:1359-1368 (2004).

Burkhard et al., "Optical properties of $In_{1-x}Ga_x P_{1-y}As_y$, InP, GaAs, and GaP determined by ellipsometry," J. Appl. Phys., 53(1):655-662 (1982).

Burkhard et al., "Dielectric functions and optical parameters of Si, Ge, GaP, GaAs, GaSb, InP, InAs, and InSb from 1.5 to 6.0 eV," The American Physical Society., 27(2):985-1009 (1983).

Cheng et al., "Self-Quenched InGaAs Single-Photon Detector," University of California, San Diego, 9 pages (Mar. 2009).

Cova et al., "20-ps timing resolution with single-photon avalanche diodes," Rev. Sci. Instrum., 60(6):1104-1110 (1989).

Cova et al., "Avalanche Diodes and Circuits for Infrared Photon Counting and Timing: Retrospect and Prospect," Digest of the LEOS Summer Topical Meetings, 25-28 (2006).

Donnelly et al., "1-mum geiger-mode detector development," Proceedings of the SPIE, 5791(1):286-292 (2005).

Finkelstein et al., "An ultrafast Geiger-mode single-photon avalanche diode in 0.18-μm CMOS technology," SPIE Adv. Photon Counting Tech., 6372 (2006).

Finkelstein et al., "Analysis of Hot-Carrier Luminescence for Infrared Single-Photon Upconversion and Readout," IEEE Journal of Selected Topics in Quantum Electronics, 13(4):959-966 (Jul./Aug. 2007).

Finkelstein et al., "Performance trade-offs in single-photon avalanche diode miniaturization," Rev. Sci. Instrum., 78(10):103 (2007).

Finkelstein et al., "External electroluminescence measurements of InGaAs/InAIAs avalanche photodiodes," Applied Physics Letters, 91:243510 (2007).

Finkelstein, "Single-Photon Frequency Upconversion via Hot-Carrier Electroluminescence," Thesis/Chapter 5, University of California, San Diego, 34 pages (2007).

Finkelstein, "Ultrafast Silicon Single-Photon Avalanche Diodes in a Commercial 0.18 μm Technology," Optoelectronics Computing Group/University of California, San Diego, 22 pages (Oct. 4, 2007).

Golovin et al., "Novel type of avalanche photodetector with Geiger mode operation," Nucl. Instr. Meth. Phys. Res. A, 518:560-564 (2004).

Gol'tsman et al., "Ultrafast superconducting single-photon detectors for near-infrared-wavelength quantum communications," Phys. Stat. Sol. (c), 2(5):1480-1488 (2005).

Hiskett et al., "Performance and design of InGaAs/InP photodiodes for single-photon counting at 1.55 μm," Applied Optics, 39:6818-6829 (2000).

Hsu et al., "A CMOS STI-Bound Single-Photon Avalanche Diode With 27-ps Timing Resolution and a Reduced Diffusion Tail," IEEE Electron Device Letters, 30(6):641-643 (2009).

Huang et al., "Counting efficiency of nuclear multiplate camera," Chin. J. Phys., 1:33-38 (1963).

Kang et al., "InGaAs-on-Si single photon avalanche photodetectors," Applied Physics Letters, 85:1668-1670 (2004).

Kerman et al., "Superconducting nanowire photon-counting detectors for optical communications," Lincoln Laboratory Journal, 16:217-24 (2006).

Lacaita et al., "Observation of avalanche propagation by multiplication assisted diffusion in p-n-junctions," Applied Physics Letters, 57:489-491 (1990).

Lacaita et al., "Single-photon avalanche diode with ultrafast pulse response free from slow tails," IEEE Electron Device Lett., 14(7):360-362 (1993).

Lacaita et al., "On the Bremsstrahlung origin of hot-carrier-induced photons in silicon devices," IEEE Trans. Electron Dev., 40:577-582 (1993).

Lacaita et al., "Photon-assisted avalanche spreading in reach-through photodiodes," Appl. Phys. Lett., 62(6): 606-608 (1993).

Lahbabi et al., "Analysis of electroluminescence spectra of silicon and gallium arsenide p-n junctions in avalanche breakdown," Journal of Applied Physics, 95:1822-1828 (2004).

Langrock et al., "Highly efficient single-photon detection at communication wavelengths by use of upconversion in reverse-proton-exchanged periodically poled LiNbO3 waveguides," Optics Letters, 30:1725-1727 (2005).

Linga et al., "Solid State Photomultiplier: Noise Parameters of Photodetectors with Internal Discrete Amplification," Proc. of SPIE, 6119:143-152 (2006).

Maruyama et al., "Development of a near-infrared photon-counting system using an InGaAs avalanche photodiode," Optical Engineering, 41:395-402 (2002).

Marwick et al., "Single photon avalanche photodetector with integrated quenching fabricated in TSMC 0.18 μm 1.8 V CMOS process," Electron. Lett., 44(10):643-644 (2008).

Newman, "Visible light from a silicon p-n junction," Physical Review, 100:700-703 (1955).

Niclass et al., "A single photon avalanche diode array fabricated in 0.35 μm CMOS and based on an event-driven readout for TCSPC experiments," presented at the 32nd Eur. Solid-State Circuit Conf., Montreux, Switzerland (2006).

Niclass et al., "A single photon avalanche diode implemented in 130-nm CMOS technology," IEEE J. Sel. Topics Quantum Electron., 13(4):863-869 (2007).

Pellegrini et al., "Design and performance of an InGaAs-InP single-photon avalanche diode detector," IEEE Journal of Quantum Electronics, 42:397-403 (2006).

Ribordy et al., "Photon counting at telecom wavelengths with commercial InGaAs/InP avalanche photodiodes: current performance," Journal of Modern Optics, 51:1381-1398 (2004).

Rochas et al., "Single photon detector fabricated in a complementary metal-oxide-semiconductor high-voltage technology," Rev. Sci. Instrum., 74(7):3263-3270 (2003).

Rochas et al., "Ultra-compact CMOS single photon detector," presented at Advanced Photon Counting Techniques, Boston, MA (2006).

Rosenberg et al., "Quantum key distribution at telecom wavelengths with noise-free detectors," Applied Physics Letters, 88:021108 (2006).

Sadygov et al., "Super-sensitive avalanche silicon photodiode with surface transfer of charge carriers," Nuclear Instruments and Methods in Physics Research, A504:301-303 (2003).

Shubin et al., "Multi-element avalanche photosensor," SPIE, 2415:94-103 (1995).

Shushakov et al., "New solid state photomultiplier," Proc. SPIE, 2397:544 (1995).

Spinelli et al., "Avalanche detector with ultraclean response for time-resolved photon counting," IEEE J. Quantum Electron., 34(5):817-821 (1998).

Steen et al., "Timing high-speed microprocessor circuits using picosecond imaging circuit analysis," presented at High-Speed Imaging and Sequence Analysis III (2001).

Takesue et al. "10 GHz clock differential phase shift quantum key distribution experiment," Opt. Express, 14(20):9522-9530 (2006).

Thew et al., "Low jitter up-conversion detectors for telecom wavelength GHz QKD," New Journal of Physics, 8:32 (2006).

Tisa et al., "Variable-load quenching circuit for single-photon avalanche diodes," Opt. Express, 16(3):2232-2244 (2007).

Tisa et al., "Fully-integrated CMOS single photon counter," Opt. Express, 15(6):2873-2887 (2007).

Wei et al., "Low temperature glass-to-glass wafer bonding," IEEE Transactions on Advanced Packaging, 26:289-294 (2003).

Yamada et al., "Recombination radiation as possible mechanism of light-emission from reverse-biased p-n-junctions under breakdown condition," Japanese Journal of Applied Physics Part 1, 32:4555-4559 (1993).

Zhao et al., "InGaAs/InP MOS single photon detector," presented at Digest of the LEOS Summer Topical Meetings (2006).

Zhao et al., "Ultra Low Noise in GaAs Single Photon Detector with Transient Carrier Buffer," *LEOS 2007—IEEE Lasers and Electro-Optics Society Annual Meeting Conference Proceedings*, Lake Buena Vista, Florida, 447-448 (Oct. 21-Oct. 25, 2007).

Zhao et al., "InGaAs single photon avalanche detector with ultralow excess noise," *Applied Physics Letters*, 91:081107 (2007).

Zhao et al., "Self-quenching and self-recovering InGaAs/InAlAs single photon avalanche detector," *Applied Physics Letters*, 93:153504 (2008).

Zielinski et al., "Excitonic transitions and exciton damping processes in InGaAs/InP," *J. Appl. Phys.*, 59:2196 (1986).

* cited by examiner

A schematic representation of the dual-wavelength cross-correlated SPAD

Photon absorption probability as a function of depth for several wavelengths. The blue and pink bands represent the absorption regions corresponding to the two junctions (after [22])

Schematic of an on-chip jitter measurement circuit

Histograms of pulse time-of-arrival at the D flip-flop input

Percentage of "1"'s for various delays for jitter-characterization circuit

SHALLOW-TRENCH-ISOLATION (STI)-BOUNDED SINGLE-PHOTON CMOS PHOTODETECTOR

CROSS-REFERENCE TO RELATED PATENT APPLICATIONS

This application is a national stage application of and claims the benefit of PCT Application No. PCT/US2007/074057 filed on Jul. 21, 2007, published as WO 2007/011617, which claims priority to U.S. Provisional Patent Application No. 60/832,327, filed Jul. 21, 2006 and entitled "Shallow-Trench-Isolation (STI)-Bounded Single-Photon CMOS Photodetector". The disclosure of the two prior applications is considered part of (and is incorporated by reference in) the disclosure of this application.

BACKGROUND

This specification relates to semiconductor devices including semiconductor photodetectors.

Semiconductor p-n junctions can be used to construct photodiodes for detecting photons. An avalanche diode is one example of such photodiodes. Single-photon avalanche diodes (SPADs) are designed to detect single photons and can be used in a variety of applications, including biological, military and biometric applications. In some other image sensors, such as CMOS Active Pixel Sensors or CCDs, photon flux received by the sensing area is translated into collected charge and the collected charge is then read out as a detector output signal. Geiger-mode SPADs are different. In Geiger-mode SPADs, the output is either a digital pulse corresponding to a photon-arrival event or analog information corresponding to the precise time-of-arrival of the photon. As such, SPADs can be used both as low-light-level imagers, as well as in more exotic applications such as Time-Correlated Single-Photon Counting and Fluorescence Correlation Spectroscopy.

Geiger-mode SPADs were pioneered by Sergio Cova in the 1980's based on research from the early days of semiconductor research at Bell Labs and later at Shockley Laboratories on the avalanche behavior of semiconductor junctions. In the Geiger mode, the pn junction is biased above its breakdown voltage and, in the absence of free charge carriers, the pn junction in the Geiger mode is not conductive. When a free carrier enters the high-field region of the pn junction in the Geiger mode, the carrier is accelerated by the electric field and the accelerated carrier collides with the lattice to cause impact ionization. The impact ionization produces an electron-hole pair. The electron and the hole are accelerated in opposite directions to collide with the lattice and release additional carriers in a chain reaction. Above the breakdown voltage, carriers are generated in the junction faster than they are extracted to cause an avalanche breakdown process. The avalanche breakdown must be quickly quenched in order to prevent heating and irreversible damage to the pn junction.

The charge carriers produced by the avalanche can be electrically sensed with high timing accuracy, and the avalanche is quickly quenched to prevent damage to the p-n junction. The pn junction is then reactivated by recharging the junction in excess of its breakdown voltage. Small SPAD pixels provide such benefits as reduced dark current, lower jitter, shorter dead time and improved spatial resolution. Yet, the area of some small CMOS SPAD pixel demonstrated to date is about 3,250 $\mu m^2$, approximately 1000 times larger than commercially-available CMOS Active Pixel Sensor (APS) pixels. This relatively large pixel area for a CMOS SPAD pixel is in part due to the unique structure of the SPAD pixel, which is structured to withstand high voltages and high current densities and to be electrically isolated from the sensing circuitry. The large pixel size can make it difficult or unfeasible to manufacture large arrays of such detectors, as required in commercial imagers. In other applications which do not require arrays of SPADs, such as in Fluorescence Correlation Spectroscopy, the percentage of pixel area which is sensitive to incoming photons (fill factor) is also constrained by the aforementioned unique structure. In addition, in applications requiring large pixels (for easing the optical alignment), such as in microscopy systems, the quality of the manufacturing process can be critical for limiting false counts.

SUMMARY

In one implementation, a single photon avalanche diode (SPAD) device includes a substrate doped to exhibit a first type conductivity and having a top substrate surface and a bottom substrate surface, the first type conductivity being either one of a n-type conductivity and an opposite p-type conductivity; a well region located in the substrate from the top substrate surface and doped to exhibit a second, opposite type conductivity to leave a substrate region of the first type conductivity in the substrate between the well region and the bottom substrate surface, wherein the bottom of the well region and the top of the substrate region interfaces to form a deep p-n junction; a trench ring formed in the well region to create a trench from the top substrate surface that surrounds a first portion of the well region and leave a second portion of the well region outside the trench ring, the trench ring filled with an insulator material to form a guard ring to spatially confine the first portion of the well region; and a shallow region in the first portion of the well region inside the guard ring that is doped to exhibit the first type conductivity to have a depth from the top substrate surface less than a depth of the guard ring, a bottom part of the shallow region interfacing with a remaining of the first portion of the well region in the second type conductivity to form a shallow p-n junction.

The above device can include a second trench ring, separate from the first trench ring, and formed at an outer boundary of the well region to create a second trench from the top substrate surface that surrounds the well region and is partially located in the substrate region of the first type conductivity in the substrate. The bottom of the second trench ring interfaces with the deep p-n junction to create a boundary of the deep p-n junction and the second trench ring is filled with an insulator material to form a second guard ring.

The above device can include a detector circuit electrically coupled to bias the shallow region of the first type conductivity, the well region of the second type conductivity and the substrate region of the first type conductivity to bias the shallow p-n junction in a Geiger mode. The detector circuit comprises a quenching resistive element electrically coupled to the shallow p-n junction to produce a large resistance that makes a voltage across the shallow p-n junction to be less than a breakdown voltage of the shallow p-n junction during an avalanche breakdown process caused by absorption of a photon in the shallow p-n junction. Alternatively, in another example, the above device can include a detector circuit electrically coupled to bias the shallow region of the first type conductivity, the well region of the second type conductivity and the substrate region of the first type conductivity to bias the deep p-n junction in a Geiger mode, where the detector circuit comprises a quenching resistive element electrically coupled to the deep p-n junction to produce a large resistance that makes a voltage across the deep p-n junction to be less than a breakdown voltage of the deep p-n junction during an avalanche breakdown process caused by absorption of a photon in the deep p-n junction.

In another implementation, a single photon avalanche diode (SPAD) device is described to include a SPAD comprising a p-n junction; and a detector circuit electrically coupled to the SPAD to bias the p-n junction in a Geiger mode. The detector circuit comprises a quenching resistive element electrically coupled to the p-n junction to produce a large resistance that makes a voltage across the p-n junction to be less than a breakdown voltage of the p-n junction during an avalanche breakdown process caused by absorption of a photon in the p-n junction. The quenching resistive element comprises an active recharge circuit electrically coupled in series to the p-n junction to control quenching and recharging the p-n junction in the avalanche ionization process. The active recharge circuit includes a quenching transistor whose source or drain is electrically connected to the p-n junction, the quenching transistor being electrically controlled to exhibit the large resistance; a recharge transistor whose source or drain is electrically connected to the p-n junction, the recharge transistor being electrically controlled to exhibit a small resistance less than the large resistance; and a control circuit comprising a control transistor electrically coupled to the quenching transistor and the recharge transistor and operable in response to a sensing voltage at the p-n junction to turn on the quenching transistor to supply the large resistance to the p-n junction while turning off the recharge transistor when the sensing voltage is at a first level when the p-n junction is in the avalanche ionization process, and turn off the quenching transistor and turn on the recharge transistor to supply the small resistance to the p-n junction when the sensing voltage is at a second level when the p-n junction needs to be recharged.

In another implementation, a single photon avalanche diode (SPAD) device is described to include a substrate; a first SPAD monolithically formed on the substrate; a second, separate SPAD monolithically formed on the substrate; a D flip-flop circuit monolithically formed on the substrate and electrically connected to (1) the first SPAD to receive an output from the first SPAD at an data input of the D flip-flop circuit, and (2) the second SPAD to receive an output from the second SPAD at a clock input of the D flip-flop circuit; and a variable delay line monolithically formed on the substrate and electrically connected in a signal path between the second SPAD and the clock input of the D flip-flop circuit to cause a delay.

In yet another implementation, a single photon avalanche diode (SPAD) device includes a substrate doped to exhibit a first type conductivity and having a top substrate surface and a bottom substrate surface, the first type conductivity being either one of a n-type conductivity and an opposite p-type conductivity; a well region located in the substrate from the top substrate surface and doped to exhibit a second, opposite type conductivity to leave a substrate region of the first type conductivity in the substrate between the well region and the bottom substrate surface, wherein the bottom of the well region and the top of the substrate region interfaces to form a deep p-n junction; a trench ring formed at an outer boundary of the well region to create a trench from the top substrate surface that surrounds the well region and is partially located in the substrate region of the first type conductivity in the substrate, wherein a bottom of the trench ring interfaces with the deep p-n junction to create a boundary of the deep p-n junction and the trench ring is filled with an insulator material to form a guard ring; and a shallow region in the well region and spaced from the guard ring that is doped to exhibit the first type conductivity to have a depth from the top substrate surface less than a depth of the well region from the top substrate surface, a bottom part of the shallow region interfacing with a remaining of the well region in the second type conductivity to form a shallow p-n junction.

These and other implementations and their operations and properties are described in greater detail in the drawings, the description and the claims.

DETAILED DESCRIPTION

Figure 1A:
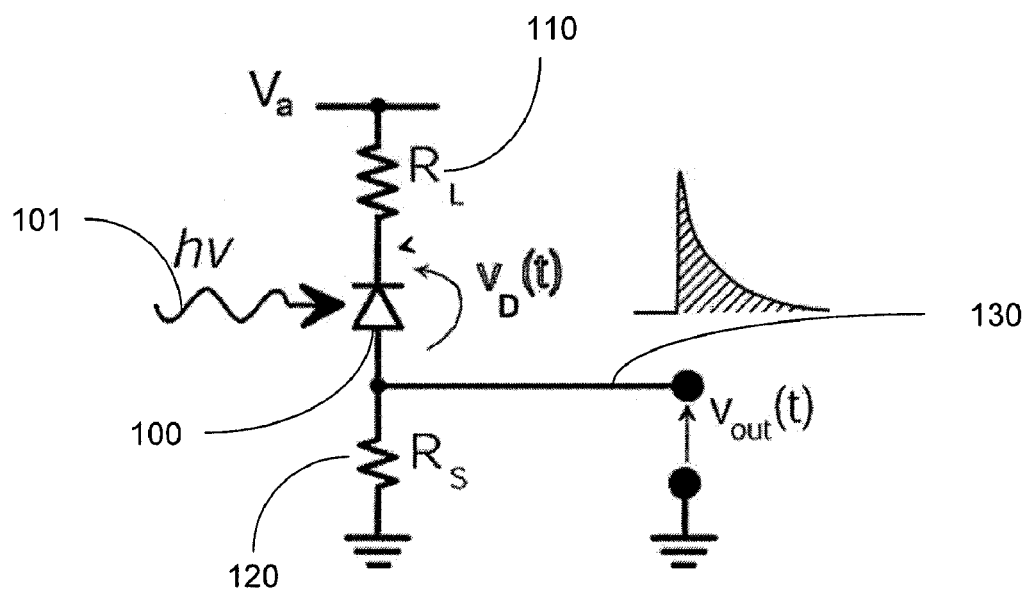
FIG. 1A illustrates an example of a SPAD device which includes a SPAD 100 reversed biased in the Geiger mode.

This specification describes, among others, semiconductor detectors incorporating trench isolation guard rings capable of withstanding high electric fields in a more compact way than other detector structures. Such a guard ring encloses a boundary of a p-n junction region and can spatially confine diffusion of charges at the p-n junction to planarize the interface of the p-n junction of the diode. As a result, the guard ring can be used prevent premature breakdown and improves uniformity of the electric filed distribution along the pn junction and thus the detection probability across the detection area or active area of the p-n junction. In a SPAD design with a p-implanted shallow region, an n well region a p doped substrate region, a shallow pn junction is formed between the shallow region and the well region and a deep pn junction is formed between the well region and the substrate region. A guard ring can be formed to enclose the boundary of either or both of the shallow and deep pn junctions. Implementations of such guard rings can be used to achieve high fill factors and small pixels and thus can be used to construct compact and high performance sensor arrays. The fabrication of detectors with guard rings described in this application can be compatible with advanced integrated circuit fabrication technologies to allow for integration of various signal processing circuitry on the same die as the detector array.

In one implementation, for example a silicon Single-Photon Avalanche Photodetector (SPAD) manufacturable using commercially-available manufacturing processes is described. A Shallow Trench Isolation (STI), available in various commercial advanced CMOS manufacturing processes, is used to planarize and isolate a p-n junction. By biasing the junction in the detector above its breakdown voltage in a Geiger mode, absorption of a single photon can induce a photo-avalanche which can be detected. The arrival of a photon generates a digital signal which is independent of the number of arriving photons, and thus the gain can be said to be "infinite." Specialized circuitry, either on or off the chip, can be implemented to detect the occurrence of the photon-arrival event and the precise time-of-arrival of the photon.

Such a SPAD can be used in a range of applications. For example, a SPAD detector array can be formed by integrating an array of SPDA detectors on the same die, with appropriate timing, biasing and counting circuitry. Such a SPAD detector array can, with appropriate active illumination, be used to provide accurate three-dimensional imaging, low-light-level two- or three-dimensional imaging with a high dynamic range, imaging of a fluorescent sample with an improved signal-to-noise ratio through a technique known as Time-Correlated Single-Photon Counting, instantaneous information on the existence and characteristics of one or more species through Fluorescence Correlation Spectroscopy, and other imaging based functions.

Designs and examples of an active recharge circuit for various SPAD devices, including but not limited to SPADs with guard rings, are described in this specification to significantly reduce after-pulsing in a Geiger mode SPAD by delaying the full recharge of the pn junction without significant change in the device dead time. The described active recharge circuit designs can be used to improve the SPAD performance and to facilitate miniaturization of high-speed SPADs. Such an active recharge circuit can be implemented as a digital-only circuit block and can be monolithically integrated with the SPAD on the same die using, e.g., the commercial 0.18-μm process. A detector dead time of about a 3 ns can be achieved in a prototype design, which is three times shorter than the dead time achieved in some other SPAD devices.

A SPAD described in this application can be configured to properly bias the shallow and deep pn junctions to enable simultaneous detection of light of two different wavelengths in the same SPAD device or the same SPAD pixel in a SPAD array. SPADs in general are wavelength agnostic, i.e., they are triggered by any photon which is absorbed and creates an avalanche in the p-n junction. A SPAD described in this application can be configured to use the shallow pn junction and the deep pn junction to generate two distinct electrical signals in the same pixel, a first signal from the shallow pn junction with a high likelihood to correspond to absorption of a short wavelength photon and a second signal from the deep pn junction with a high likelihood to correspond to absorption of a longer wavelength photon.

The pixel jitter or timing accuracy is an important figure of merit for characterizing performance of SPADs. Measuring this timing accuracy can be complicated because the jitter is greatly increased as the signal is passed through additional amplification stages of a SPAD and si directed outside the SPAD chip. SPAD devices are described in this application to include a circuit integrated on the SPAD die for statistically estimating the pixel jitter using simple circuit elements and low-frequency signals at the integrated-circuit interface with circuits and devices outside the detector chip. Hence, such SPAD devices have a built-in pixel jitter characterization mechanism.

Geiger-mode SPAD devices and techniques described in this specification provide information on individual photon-arrival events as opposed to other image sensors which provide an aggregate temporal average of impinging photons. Hence, SPAD devices can be used to obtain a binary output corresponding to a photon arrival event within the exposure window of the detector, time density of photon arrival events, corresponding to the instantaneous photon flux, and photon times-of-arrival statistics. Geiger-mode SPAD devices can be characterized by a number of parameters, including (1) detection probability that an impinging photon generates an electrical output; (2) spectral response of the pn junction (longer wavelength efficiency is desirable in many applications); (3) noise caused by various factors such as thermal noise, noise caused by tunneling of carriers and correlated noise due to afterpulsing; (4) jitter caused by the time uncertainty in determining the photon arrival time; (5) the count rate representing the number of counts per unit time; (6) detector active area where some application require a large pixel area to ease optical alignment and other applications may require a small active area for detector miniaturization and array integration; and (7) the fill factor which is the percentage of the active area sensitive to incoming photons over the total area of a SPAD detector on the die.

One notable feature of a Geiger mode SPAD device is its operating mechanism based on extremely high electric fields and high instantaneous currents. Because of this, SPADs have traditionally been manufactured using processes which are specially designed and are different in various aspects from commercial CMOS processes. These specialized SPAD processes offer many benefits, such as high detection efficiencies, low jitter and desirable spectral response, especially in longer wavelengths. However, these specialized SPAD processes are expensive and create issues of integration with CMOS circuitry. For example, a specialized SPAD process tends to have a relatively low quality (high defect density) as compared to commercially-available CMOS processes, leading to a large dark count (low dynamic range) and high after-pulsing rates (low frame rate); have a relatively low spatial resolution, leading to lower timing accuracy and higher dark count; and require externally bonded dies for timing, counting and biasing, thus increasing the parasitics and decreasing the timing accuracy and re-charge time (frame rates). The SPAD designs in this specification are configured to allow form manufacturing of SPADs in commercial Complementary Metal-Oxide-Semiconductor (CMOS) technologies. Using CMOS processes for fabricating SPADs can provide significant cost savings and benefit from economies of scale and the quality benefits resulting in high-volume production.

FIG. 1A illustrates an example of a SPAD device which includes a SPAD 100 reversed biased in the Geiger mode. Two resistive elements RL 110 and RS 120 are electrically connected to the two sides of the SPAD 100 in series, respectively. A bias voltage source 140 is connected to supply the reverse voltage bias to the SPAD 100 via the resistive element 110. A readout 130 is connected to the SPAD 100 to read the output of the SPAD 100. The resistive elements 110 and 120 can be used to collectively provide a sufficient quenching resistance to quench the avalanche breakdown process in the SPAD 100 to make the voltage drop across the pn junction of the SPAD 100 to be less than the junction breakdown voltage. In implementations, the resistive elements 110 and 120 may be a resistor or a transistor whose drain or source is connected to the SPAD 100 in series to provide the sufficient quenching resistance. One of the resistive elements 110 and 120 can be part of a SPAD control circuit. In one implementation, an active recharge circuit can be provided as part of one of the resistive elements 110 and 120 to control a delay in the timing between the quenching operation at the SPAD 100 and the recharging operation at the SPAD 100 based on a self-timed sensing mechanism in the circuit.

Figure 1B:
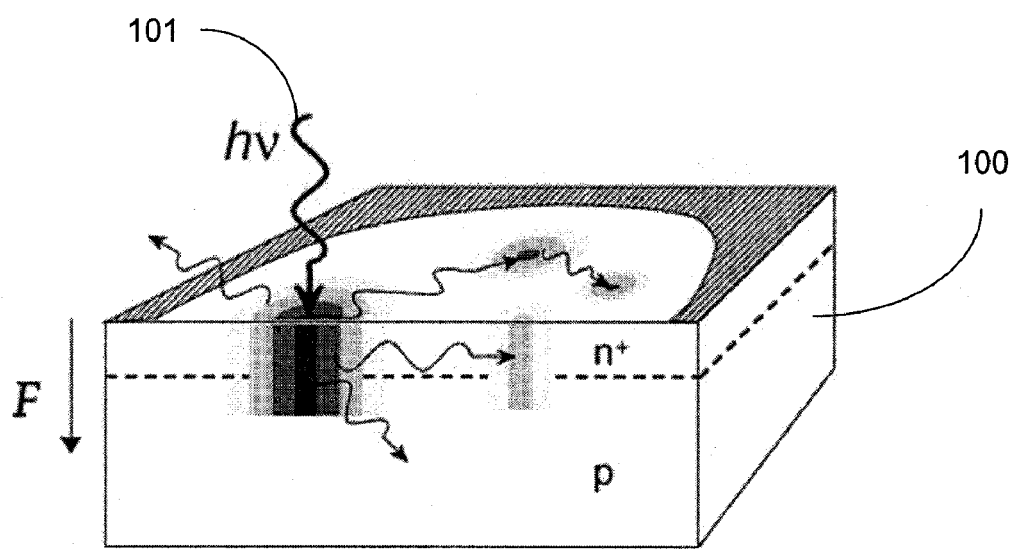
FIG. 1B illustrates operation of the SPAD device in FIG. 1A.

FIG. 1B illustrates the operation of the pn junction formed between a shallow n region and a deep p region in one example of the SPAD 100 in FIG. 1A. The shallow n implanted region is near the sensing surface of the SPAD 100 where the light enters the SPAD 100. The pn junction is reversed biased in the Geiger mode to cause the avalanche breakdown after absorbing an incident photon 101.

The example silicon SPAD with a STI guard ring described here uses the amplification property of a photo-generated electron-hole pair under a strong electric field in the depletion region of a silicon p-n junction. A single-photon detection occurs through the following steps. The p-n junction is biased at a voltage in excess of the breakdown voltage of the junction. A photon of energy higher than the work energy of silicon is absorbed in the depletion region of a p-n junction, or within a diffusion length of the depletion region and generates an electron-hole pair. The electron and hole are accelerated within the depletion region by the electric field and collide with silicon atoms, ionizing them and releasing additional electron-hole pairs. If the rate of generation of electron-hole pairs is higher than the rate of their extraction from the depletion region, a breakaway avalanche takes place and is quenched by a quenching resistor to prevent irreversible burnout of the diode.

The geometry profile of the pn junction is SPAD 100 can have significant impact to the performance of the device. Curved junctions break down at a lower voltage as compared to planar junctions. The back-end of industrial CMOS processes are constructed of consecutive implantation and diffusion stages, where energetic impurity ions are implanted in the silicon substrate forming n-type and p-type regions. Due to collisions between the implanted ions and the silicon lattice, and due to subsequent diffusion, the edges of the implant are rounded. An avalanche breakdown is expected to first occur at the highest curvature regions. This is undesirable for the operation of a SPAD because it results in a spatially non-uniform detection probability across a pixel, creates potentially destructive localized high current (micro-plasmas) and requires a large voltage swing for proper operation of the device.

A planar interface of the pn junction in the SPAD 100 is desirable feature because the electric field distribution at a planar pn junction is uniform and thus provides a uniform breakdown voltage to reduce premature breakdown during device operation. Other SPAD designs tend to produce curves with small curvatures of radius in pn junctions and such non-planar features have higher electric fields than other areas. Experience and research on pn junction have shows that non-planar junctions tend to experience breakdown at different voltages in separate regions of the junction, e.g., planar region, sides and corners. This effect can lead to excessive current densities in areas breaking down prematurely and is undesirable. Non-planarities in pn junctions can also lead to localized breakdown (microplasmas). In advanced processes which have high doping concentrations and shallow junctions, non-planarities are more significant and thus are problematic. Therefore, a key premise in the design of SPAD devices is the formation of a planar junction.

In recognition of the above, a compact insulator guard ring, such as a silicon-dioxide shallow trench isolation guard ring, can be provided in a SPAD to reduce non-planar features with small curvatures of radius at a pn junction. For example, a silicon SPAD can be constructed with one or more such insulator guard rings to form a small, high-quality device pixel and such a silicon SPAD is manufacturable in deep-submicron standard silicon CMOS technologies. One implementation of a guard ring for a SPAD is to use a Shallow-Trench Isolation (STI) process which is used in CMOS circuits to for STI structures that prevent latch-up and cross talk between different circuit elements in CMOS circuitry, to form a STI ring as the guard ring to planarize a pn junction and to reduce non-planar junction features.

Consider an example of a p+/n junction formed by a highly-doped $p^+$ layer (usually used as source/drain implant of PMOS transistors) and an N-well layer (traditionally used in the construction of PMOS transistors) in an avalanche diode. In a commercial CMOS process, a p+ doping is achieved by ion implantation and subsequent diffusion. This diffusion tends to produce a curved doping profile which leads to a curved p-n junction. When an electric potential is applied across this curved pn junction, the electric field will maximize in the highest curved regions and a junction breakdown likely occurs first at these regions while a higher potential is used to achieve breakdown at the more planar junction region at the center of the junction. A guard ring in a SPAD described in this application is located at the boundary of the pn junction and inhibits formation of the curved region during the post-implantation diffusion. As a result, a planar pn junction is formed to reduce the probability of premature breakdown which usually occurs at the edges and corners of the p+ implant region. The STI guard ring is formed before the implanatation of the n-well and p+ regions. The p+ layer is implanted such that its edge overlaps and terminates at the STI guard ring to form a planar p+n junction.

Figure 2:
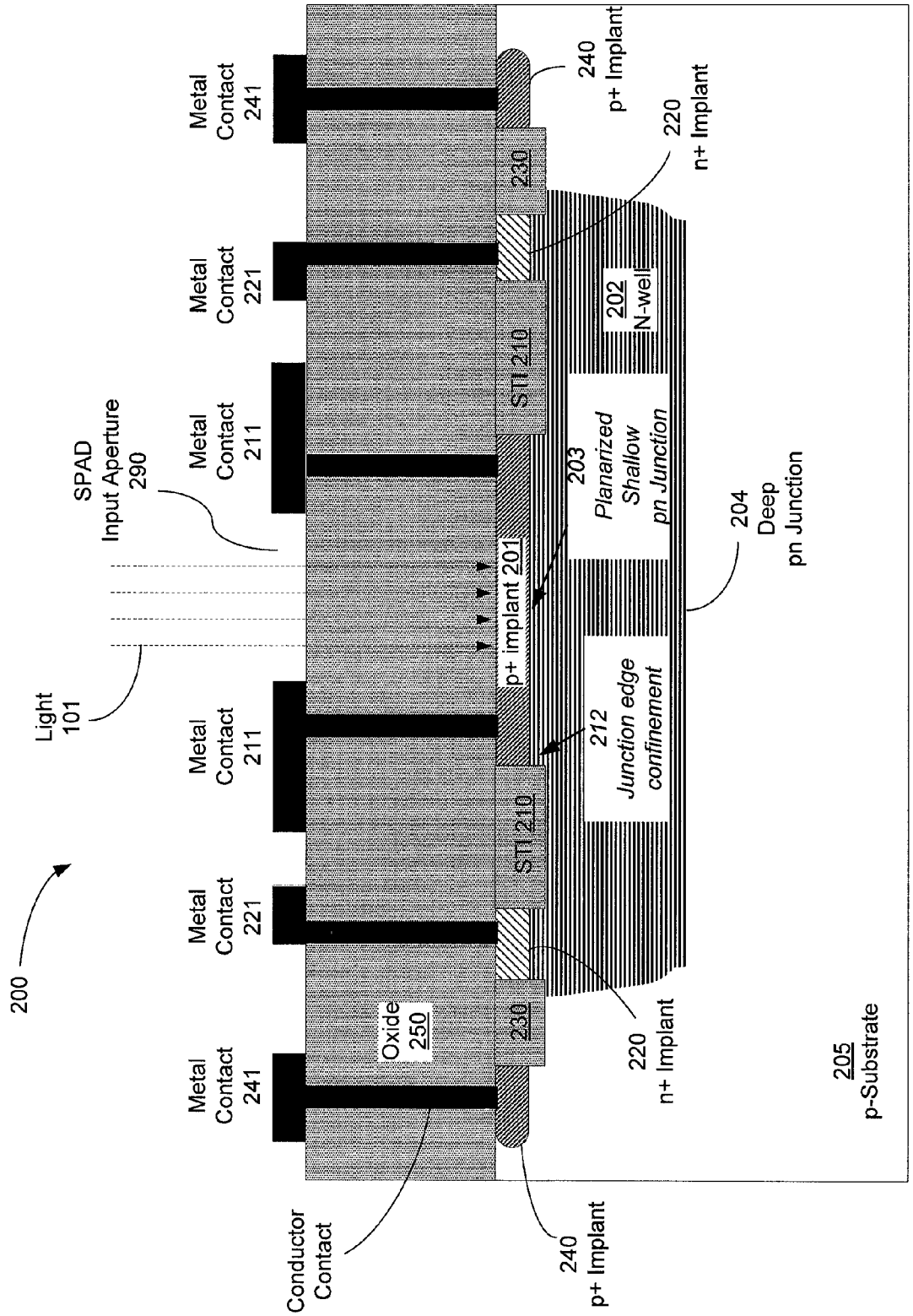
FIGS. 2, 3 and 4 show examples of SPAD devices with guard rings at pn junctions.

FIG. 2 shows an example of a single photon avalanche diode (SPAD) device 200 having a STI guard ring 210. The device 200 includes a substrate 205 doped to exhibit a first type conductivity (e.g., the p conductivity). The substrate 203 has a top substrate surface on which various features are fabricated and through which light 101 is received through a SPAD input aperture 290. The substrate 205 can also be doped to exhibit the n-type conductivity in other implementations. A well region 202 is located in the substrate 202 from the top substrate surface and doped to exhibit a second, opposite type conductivity (e.g., the n conductivity) to leave a substrate region of the first type conductivity in the substrate 205 between the well region 202 ("N well") and the bottom substrate surface. The bottom of the well region 202 and the top of the substrate region in the substrate 205 interfaces to form a deep p-n junction 204.

A trench ring 210 is formed in the well region 202 to create a trench into the well region 202 from the top substrate surface that surrounds a first, central portion of the well region 202 and leave a second, outer portion of the well region 202 outside the trench ring 210. The trench ring 210 is filled with an insulator material, such as silicon oxide or other insulator, to form a guard ring to spatially confine the first portion of the well region 202. A shallow region 201 is formed in the first portion of the well region 202 inside the guard ring 210 and is doped to exhibit the first type conductivity (e.g., p conductivity) to have a depth from the top substrate surface less than a depth of the guard ring 210. The bottom part of the shallow region 201 interfaces with a remaining of the first portion of the well region 202 in the second type conductivity to form a shallow p-n junction 203. Under this design, the guard ring 201 is at the boundary of the pn junction 203 and reduces the formation of curves at the pn junction 203. The shape of the well region 202 and the shape of the guard ring 210 can be configured in various geometries, such as a circular shape, a square shape, or an elongated shape.

Separate metal contacts 211, 221 and 241 are formed to be in electrical contact with three doped regions, the p substrate region 205, the N well 202 and the shallow p+ implant region 201, respectively. The metal contact 211 can be in direct contact with the shallow p+ implant region 201. A shallow n+ implant region 220 can be formed in the top region of the N well 202 to provide a contact pad between the metal contact 221 and the N well 202. A shallow p+ implant region 240 can be formed in the top region of the substrate 205 to provide a contact pad between the metal contact 241 and the substrate 205. An insulation region 230 can be formed between the n+ implant region 220 and the p+ implant region 240. In addition, an insulator layer 250, such as silicon oxide, can be formed on the top substrate surface as an interlayer dielectric layer to support the metal contacts 211, 221 and 241 and other structures.

The fabrication sequence for fabricating the device in FIG. 2 using a CMOS process can be conducted as follows. First, a shallow-trench-isolation silicon dioxide layer is formed in the p doped substrate. Next, an N-well region is formed in a region of the p doped substrate. This doping process can form a retrograde well such that the highest doping is at the interface of the substrate and N well. Conductive p+ implant and n+ implant layers are formed next and followed by forming contacts and patterning metallization layer. A passivation layer is then formed and patterned.

Notably, the insulator region 230 can also be formed a second guard ring to reduce any non-planar features at the deep pn junction 204 formed between the N well 202 and the p substrate region 205 in addition as an insulator between the n+ implant region 220 and the p+ implant region 240. This second trench ring 230 can be formed at an outer boundary of the well region 202 to create a second trench from the top substrate surface that surrounds the well region 202 and is partially located in the substrate region 205 in the substrate so that the bottom of the second trench ring 230 interfaces with the deep p-n junction 204 to create a boundary of the deep p-n junction 204. After this trench is formed, an insulator material such as silicon oxide is filled in to form the second guard ring. The formation of this second trench ring can be performed before the N well 202 is formed in the p doped substrate 205.

A SPAD can be made with both or either of the first and the second guard rings based on the application of the device. For example, a SPAD that is designed to use both pn junctions 203 and 204 for detecting light at different wavelengths may be made with both guard rings. For another example, a SPAD that is designed to use only the shallow pn junction 203 for detecting light may be made with only the inner guard ring 210. For yet another example, a SPAD that is designed to use only the deep pn junction 203 for detecting light may be made with only the outer guard ring 230.

Figure 3:
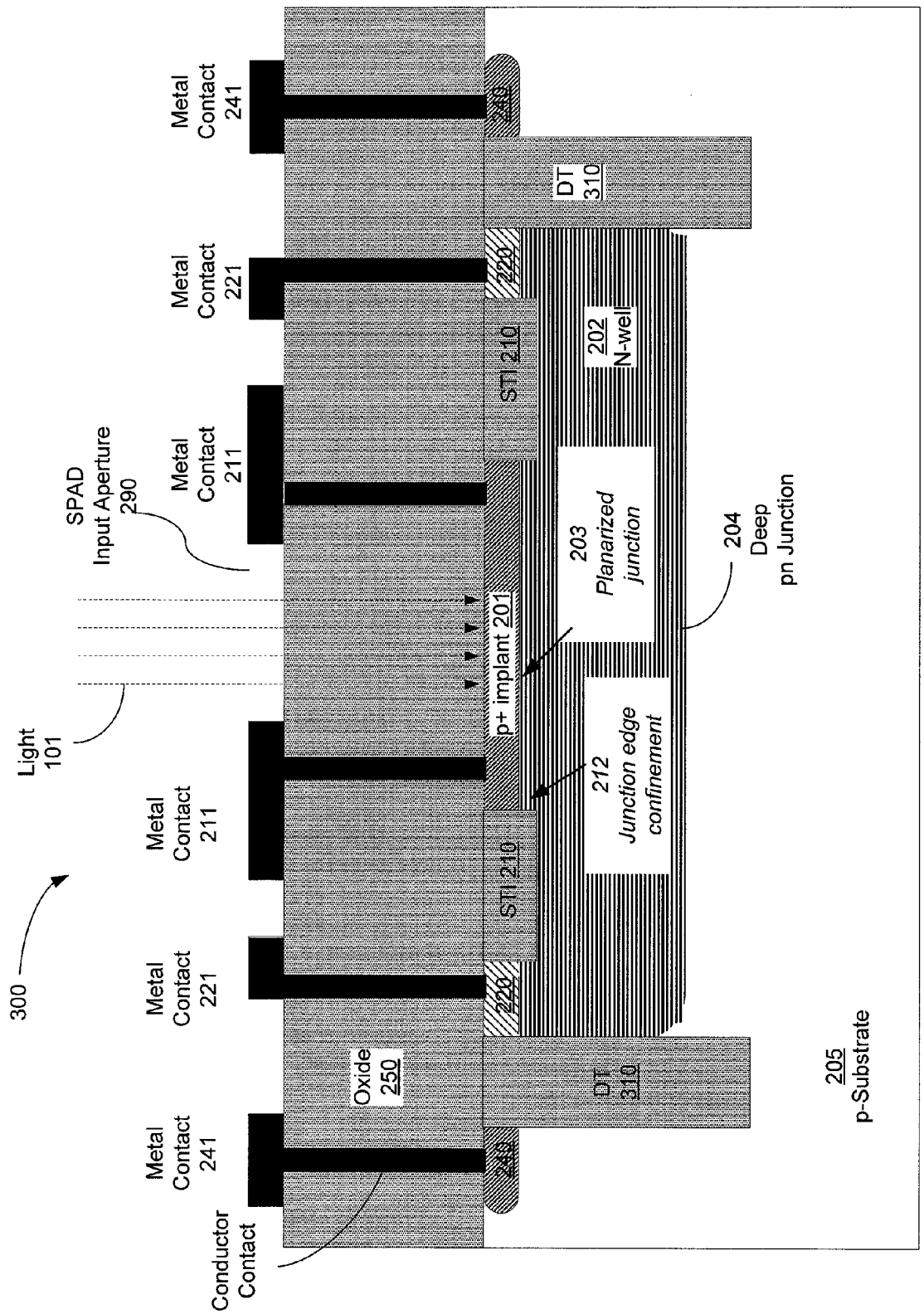

A guard ring 210 or 230 in FIG. 2 may be a shallow trench isolation ring with a depth less than the well region 202 but greater than the shallow region 201 from the top substrate surface. Alternatively, a guard ring 210 or 230 in FIG. 2 can be a deep trench guard ring with a depth greater than the depth of the well region 202. FIG. 3 shows an example of a SPAD where a deep trench (DT) guard ring 310 is formed between the regions 220 and 240 in the substrate 205.

Figure 4:
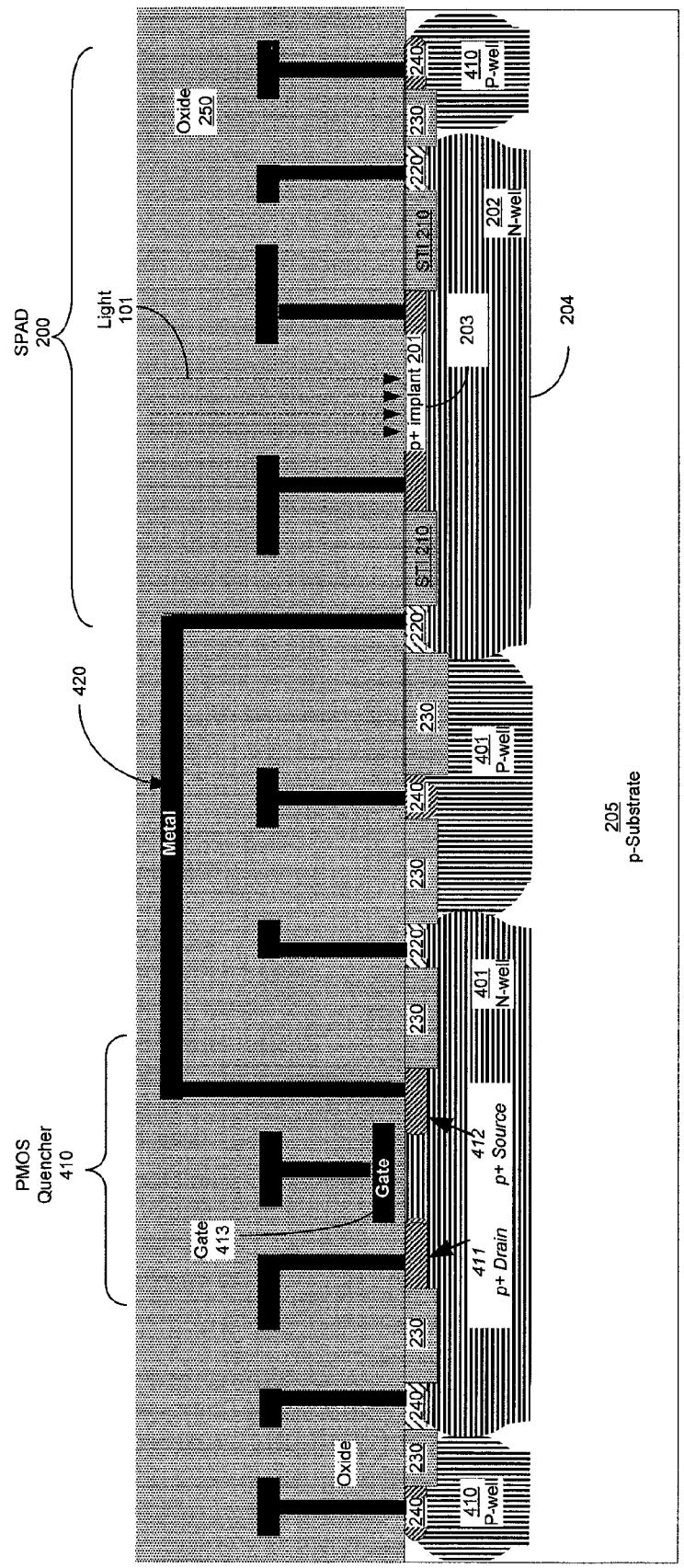

FIG. 4 shows an example of a SPAD device having a monolithically integrated quenching transistor. The substrate 205 is processed to include a separate N well 401 in which a PMOS transistor 410 is formed as the quenching resistive element for the SPAD 200 on the substrate 205. Two p+ regions 411 and 412 are formed in the N well region 401 near the top substrate surface as the drain 411 and source 412 for the transistor 410 and a metal gate pad 413 is formed at a location between the regions 411 and 412 above the top substrate surface as the gate for the transistor 410. A metal contact 420 is formed to electrically connect in series with the N well 202 of the SPAD 200 and the source 412 of the PMOS transistor 410.

The above described SPAD devices with one or two guard rings for pn junctions can be implemented to achieve one or more advantages. For example, the timing accuracy of a SPAD is determined to a large extent by the lateral evolution of the avalanche, which is, in turn, proportional to the pixel diameter. The current guard ring SPAD designs can provide SPAD pixels with an active area as small as 1 $\mu m^2$ in a 0.18 $\mu m$, whereas the smallest pixel demonstrated to date has been a 39 $\mu\mu m^2$ active area pixel in a 0.35 $\mu\mu m$ technology.

For another example, the dynamic range is limited by the dark current rate and the dark current rate in Geiger-mode SPADs is dominated by Shockley-Reed-Hall trapping and thermally-activated release of electrons. This noise is linearly proportional to the area of the junction. Therefore, the dark current and thus the dynamic range can be significantly improved in the new, smaller junction based on the guard ring SPAD designs. Furthermore, Shockley-Reed-Hall trapping is greatly reduced with high-quality processes, where defect densities are low. In commercial mass-manufacturing processes, such defect densities are considerably lower than in custom processes.

Another SPAD performance parameter, the frame rate, defines the time between consecutive avalanches, and affects the rate at which acquisitions can be updated. This parameter is a function of the capacitance of the p-n junction (and through it of the re-charge time) and of the after-pulsing probability function. A smaller-area junction will have a smaller capacitance as well as a narrower after-pulsing probability tail (because fewer charges fill traps in the junction area). Similarly, a pixel whose sensing circuitry is integrated on the same die as the junction, will exhibit a smaller pixel capacitance and a narrower after-pulsing tail.

The image acquisition time is an important parameter in imaging applications. The timing lag inaccuracy (jitter) between the instance of arrival of a photon and the clocking of the resultant electrical signal can be described by a Gaussian function with a standard deviation $\sigma$. In order to acquire an accurate three-dimensional image, this standard deviation must be minimized, e.g., to approximately 30 psec for facial mapping. Minimization can be achieved by repeated sampling of a still image. For M over-samples, the equivalent resultant standard deviation becomes $M^{-1/2} \cdot \sigma$. For the competitive sensor described above, 10,000 samples are required for each sample, resulting in an acquisition time of 200 msec per pixel, and more than 200 sec for a 32×32 pixel array. It can therefore be seen that the new device, which exhibits a much lower jitter σ, the total acquisition time is significantly reduced, making it possible to acquire real-time and moving images. Because image acquisition time depends on the time between samples, a shorter recharge time, as described above, will also reduce the overall acquisition time.

The present guard ring SPAD designs can also be sued to improve the timing resolution. For a number of applications, such as Time-Correlated Single Photon Counting, the absolute time between a reference event (such as a laser pulse) and the photon absorption event, must be known with maximal accuracy. As described above, the lower jitter of the new device based on a guard ring SPAD design makes it more amenable for such applications.

The spatial resolution of an SPAD array can be improved by increasing the density or pitch of pixels. This pitch is determined by the pixel size as well as the inter-pixel spacing. As mentioned above, the pixel in the present designs can be significantly smaller than the pixels in many other designs. Inter-pixel spacing is determined by the optical cross-talk, which is a function of the total number of charge-carriers taking part in the avalanche. Since the surface area, total volume and overall capacitance of the new device are all significantly reduced, so will the optical cross-talk, resulting in further improvement in pixel pitch and spatial resolution.

Another performance parameter for a SPAD is the detection probability of a photon received by the SPAD and is a factor of the fill factor, quantum efficiency and avalanche probability. The fill factor in a SPAD device based on a guard ring SPAD design can be significantly improved, e.g., 30% versus 1.1% in similar-sized active-area pixels without the guard rings. Therefore, for comparable photon fluxes impinging uniformly on the SPAD device, the detection probability of a guard ring SPAD can be significantly improved by a factor of 30.

Devices based on guard ring SPAD designs can also provide benefits in power supply, power consumption and heat dissipation. The operating voltages for various other SPAD devices range from approximately 25V to many hundreds of volts. These voltages are difficult to work with in standard CMOS, where 3.3V is usually the maximum operating voltage. A SPAD device based on the present guard ring SPAD designs can be configured to have a maximum voltage of 13.5V and thus is much easier to implement in a CMOS process. In addition, because much fewer charge carriers flow in the avalanche in the present SPAD device, the total power dissipation of the device is greatly reduced, making it possible to operate without requiring external cooling, and making it more amenable to mobile applications. Furthermore, because the avalanches contain less charge carriers, the total charge injected to the substrate is reduced and thus reduces interferences on surrounding integrated circuitry.

Referring back to FIG. 1A, after a photo is received by the SPAD and an avalanche occurs in the reversed biased pn junction in the Geiger mode. An electrical voltage signal of the avalanche and its quenching are detected by a read circuit, which records the pulse's time of arrival, corresponding to the photon's time of arrival. The control circuit re-charges the capacitance of the diode in preparation for a subsequent photon. During this re-charging "dead" time, the pixel is not sensitive to the arrival of photons.

Figure 5:
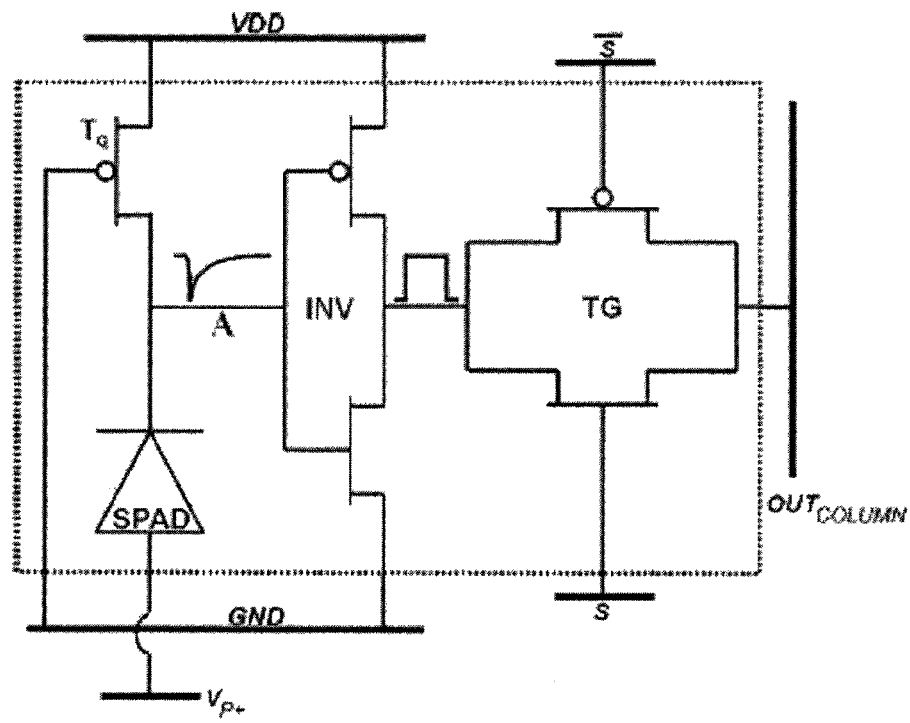
FIGS. 5 and 6 illustrate two examples of SPDA circuits.

The above operation for detecting the SPAD's avalanche pulse can be achieved via various SPAD control and readout designs. FIG. 5 shows one example of a SPAD circuit design which can be used for controlling a guard ring SPAD device described in this application and other SPAD devices. Information on this circuit design can be found in C. Niclass, A. Rochas, P. A. Besse, E. Charbon, "Design and Characterization of a CMOS 3-D Image Sensor Based on Single Photon Avalanche Diodes", IEEE J. of Solid-State Circuits, Vol. 40, No. 9, 2005.

The circuit in FIG. 5 is for an SPAD array imaging device having an array of SPAD pixels, each containing a SPAD. The substrate of the device is grounded through the pixel's outermost $p^+$ ring. The N-well (through an $n^+$ contact) is connected to a positive voltage of 3.3V through a quenching transistor $T_q$. The $p^+$ region is connected to a negative voltage of 11V. Initially, no photons impinge on the SPAD. No current flows through $T_q$ and the voltage across the SPAD is 3.3V−(−11V)= 14.3V. The voltage at point A is 3.3V, and at the output of the inverter it is 0V. When an avalanche is triggered, current quickly starts flowing in the SPAD. The voltage across the quenching transistor increases, resulting in a quenching of the avalanche. The capacitance of the SPAD is then re-charged through the quenching transistor. The voltage glitch associated with the avalanche quenching and junction re-charge is sampled by an output stage—an inverter in the example described here—and is read off through a pass gate. A new avalanche may now be triggered.

Figure 6:
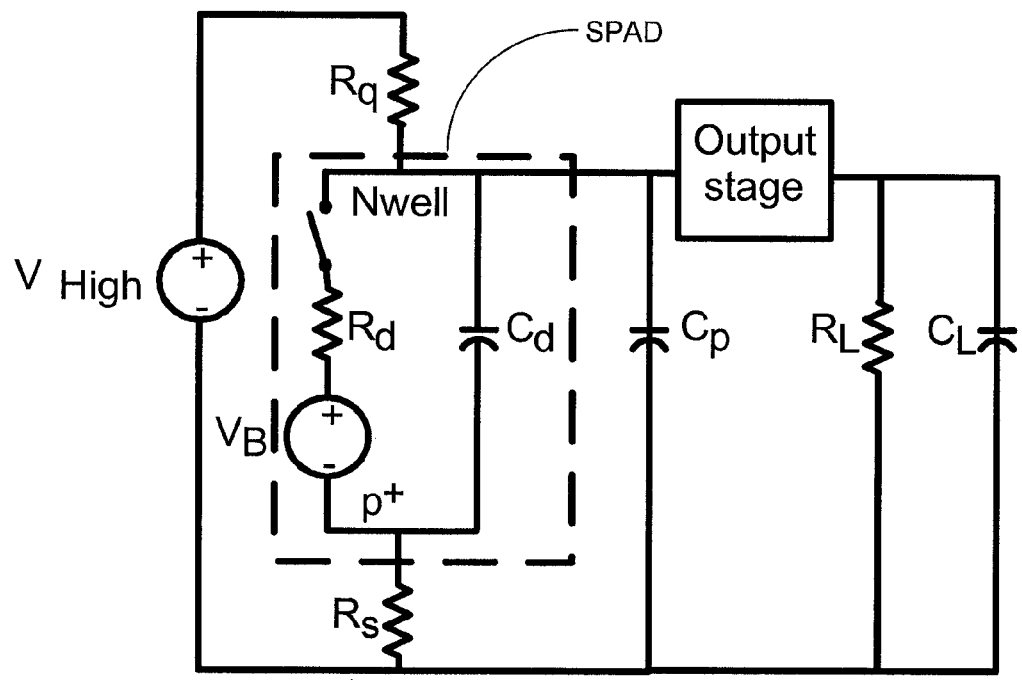

FIG. 6 shows an example of an effective circuit for a SPAD device that can be used for a guard ring SPAD device. A quenching resistive element Rq is shown to be connected in series with the SPAD represented by a box with dashed lines. A voltage source $V_{HIGH}$ pre-charges the Nwell/$p^+$ junction, which is enclosed in a rectangle in the drawing. The junction itself is comprised of a resistance $R_d$ and a capacitance $C_d$. The resistance can include the ohmic resistance from the contact to the neutral region of the junction, the resistance of the neutral region, and the space-charge resistance, which is due to charge crowding during the avalanche. The first element can be readily extracted from resistivity data of the N-well material which is provided by the foundry. It increases with distance and decreases with doping. The second and third elements increase with smaller diode area. The latter is given by Sze and Shockley as $R_s=1/GN$ where $N=A/W^2$ is the number of unit cubes in the depletion region with cube edge equal to the depletion width, and G=40 μmhos for silicon. Measurements on a 15 μm-diameter triple-well SPAD with a depletion region width of approximately W=0.5 μm, found this total resistance to be approximately 1 kΩ. The value of the space-charge resistance for this structure is $R_s=1/(40\times 10^{-6}\times 15^2/0.5^2)\approx 28\Omega$, i.e., the total resistance is dominated by the series resistance. Because the neutral region is very thin, the dominant component of $R_d$ must be the ohmic resistance of the N-well. Even for a much smaller SPAD pixel with a 4 μm² active area, $R_s=390\Omega$ is much smaller than the ohmic resistance. Since the path from the electrode to the junction in the STI-bounded SPAD is significantly shorter than that of the triple-well SPAD, we conservatively assume a resistance of 1.5 kΩ.

The diode capacitance is simply the diode's depletion capacitance which is the junction capacitance results from the depletion region at the p-n interface. This capacitance varies in inverse proportion to the width of the depletion region, which is itself a function of the applied voltage $V_A$. The junction capacitance scales with the area and perimeter of the device: $C=C_a\times Area+C_p\times Perimeter$. The voltage (reverse bias is negative voltage) dependence of $C_a$ and $C_p$ is given by (i=a or p)

$$C_i = \frac{C_{io}}{\left(1 - \frac{V_A}{V_{bi}}\right)^{m_i}}$$

The parameters used in these equations for the capacitance are given in Table 108.

Capacitance Parameters for P+Nwell Diodes

|  | Capacitance Parameter Values | | |
|---|---|---|---|
|  | Cio | Vbi | mi |
| Area Capacitance | 1.15 ± 14% (fF/μm²) | 0.73 | 0.39 |
| Perimeter Capacitance | 0.100 ± 25% (fF/μm) | 0.99 | 0.01 |

For a 7 μm×7 μm diode reverse-biased at $V_A=-11V$, the capacitance is 22 fF and for a 2 μm×2 μm diode it is 2.34 fF. In both cases, and especially in the smaller diode, the parasitic capacitance, $C_p$, which must be charged and discharged together with the depletion region's capacitance, must be accounted for. With special attention to routing, this parasitic capacitance is dominated by the gate capacitance of the sensing stage, with a capacitance of:

$$C_{ox} = \epsilon_0 A/t_{ox} = 1.1 \text{ fF}/\mu m$$

The value of the quenching resistor can be determined by considering the requirements for terminating the avalanche process in an abrupt manner. Haitz determined that when the current through a diode falls below 60 μA, the probability of a self-sustaining avalanche drops significantly. A commonly used rule-of-thumb places this final current at 100 μA. In our design, we planned for $I_f=20$ μWA and $V_e=2.5V$, resulting in $R_q=120$ kΩ. This resistor can either be implemented using a resistive element which is part of the process offering, or be an active resistor in the form of a MOSFET, as long as the voltage across any two of its nodes does not exceed 3.3V. Using an active resistor has three advantages: a) it is more compact in area and b) its temperature coefficient is lower and c) its resistance value can be externally controlled by adjusting its gate voltage.

Figure 7:
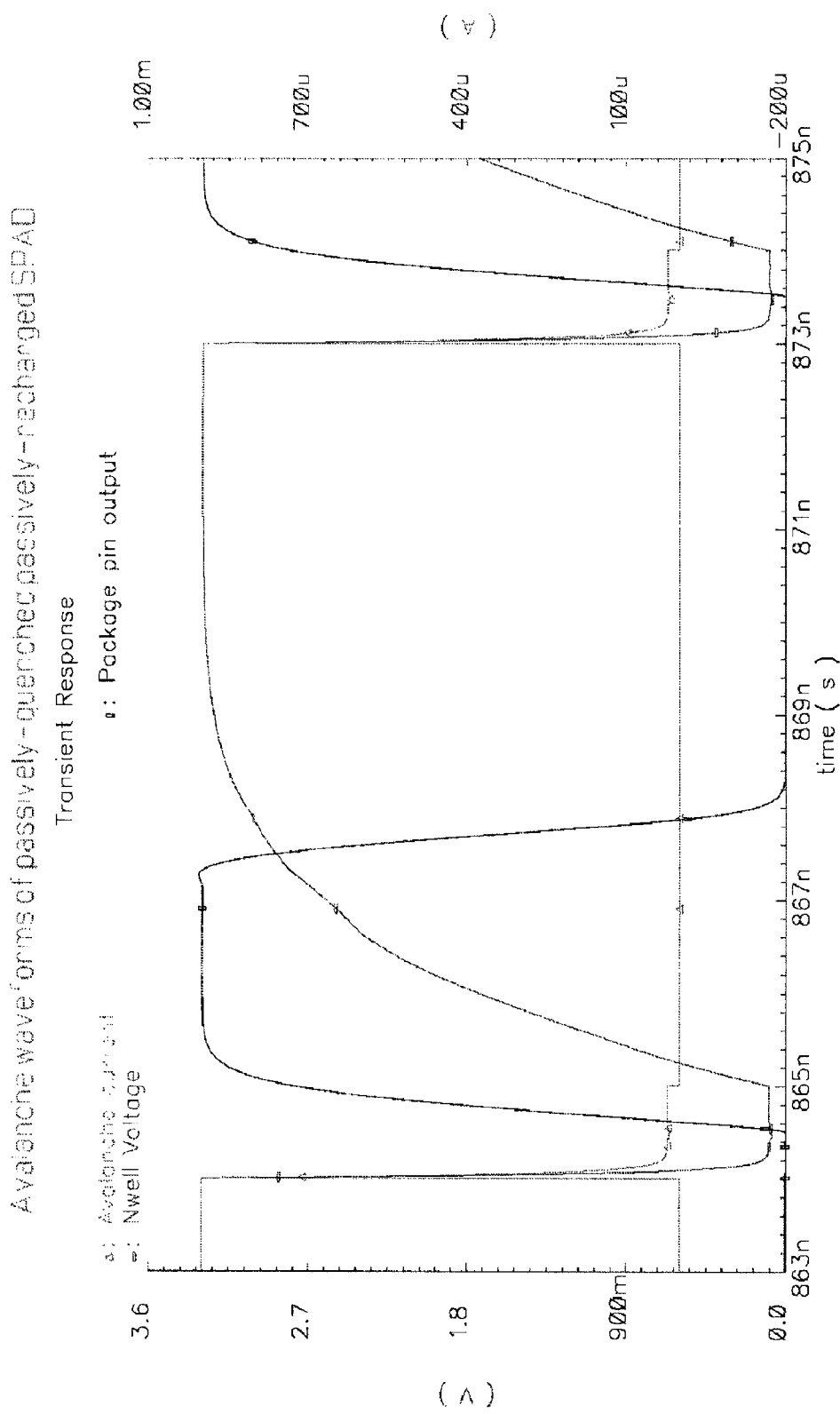
FIG. 7 shows N-well and Output waveforms for passively-quenched SPAD with source-follower output stage.

Based on our measurements from the first chip, the external capacitance is assumed to be 2 pF. The external resistance is the 50Ω termination of the oscilloscope. Two output buffer configurations were studied. A source-follower output is the simplest one and provides the most direct observation of the actual current flowing in the diode. FIG. 7 shows N-well and Output waveforms for passively-quenched SPAD with source-follower output stage. As can be seen from FIG. 7, the voltage across the diode varies over a relatively long recharge time of 4 ns. This is undesirable, because the avalanche probability is strongly dependent on the excess voltage so that with the present scheme we have a non-uniform detection probability during this relatively long interval. Moreover, because the after-pulsing probability decays exponentially with time, but can be self-sustaining, it is important to control (and therefore delay) the time between an avalanche and the full recharge of the junction. This is in contrast with the situation in larger SPADs where the aim is to reduce the recharge time, which is determined by the RC time constant of the SPAD and the junction's parasitic capacitance.

An example of an active recharge SPAD circuit is described below for controlling various SPAD devices including guard ring SPAD devices described in this application. This example is a compact self-timed active-recharge circuit which may be incorporated into a SPAD array. The requirements of such a circuit include a) It should not interfere with the fast quenching operation; b) It should maintain only two diode states—charged or not charged, i.e., the recharging time should be short; c) It should be small; and d) It should be insensitive to noise and other environmental changes characteristic of SPADs.

In the active-quenched pixel (FIG. 6), the quenching resistor found in the passive pixel, which also serves for recharging the diode, is replaced by two resistors. A high value quenching resistor with $R_{quench}=1.2$ MΩ (implemented with P_quench) ensures a fast avalanche quenching with minimum current flowing whenever the diode is not being quenched. A second, smaller resistor (P_recharge) is used for an ultra-fast recharge, with $R_{recharge}=24$ kΩ. For proper quenching, the small recharge resistor must be disconnected during recharge to maintain a high effective quenching resistance.

Detection probability is one important figure of merit of single photon avalanche diodes. It is determined by the ability of the SPAD's absorbing layer to absorb photons in the relevant wavelengths and by the capability of the device to separate the photogenerated electron-hole pair and multiply it to a detectable avalanche. In some devices, such as asilicon SPAD in FIG. 2, the absorption and multiplication regions coincide in the depletion region of a pn junction. The photon absorption probability is:

$$P_{abs}(\lambda) = \exp(-\alpha_{Si}(\lambda) \cdot (x_j + w_d)) - \exp(-\alpha_{Si}(\lambda) \cdot w_d)$$

where $\alpha_{Si}(\lambda)$ is the absorption coefficient in silicon for wavelength $\lambda$, $w_d$ is the depletion region's width, and $x_j$ is the junction depth. The depletion region's width depends on the doping profile of the lighter-doped region and on the applied bias:

$$w_d = \left(\frac{3V_B \epsilon_s}{2qa}\right)^{1/3}$$

where $V_B$ is the sum of applied and built-in voltages, $\epsilon_s$ is the dielectric constant of silicon, q the electron charge and a the grading coefficient of a linearly-graded junction. As smaller geometries are used, the grading coefficient increases, thereby reducing $w_d$ and therefore the absorption probability. The only way to offset this trend is by increasing the applied voltage across the junction. Increasing this voltage also has the benefit of increasing the probability that once an electron-hole pair has been generated, the opposite charges will be swept and multiplied by impact ionizations, resulting in an avalanche.

The applied voltage, however, cannot be increased indefinitely, because SPAD noise increases with applied field. In these devices, noise stems from thermally generated carriers, direct band-to-band tunneling and from after-pulsing. Thermally-generated carrier noise, exhibits a Poissonian distribution and increases with applied field, due to a higher avalanche-initiation probability and because of increased carrier emission via the Poole-Frenkel effect. Direct band-to-band tunneling, also with a Poissonian distribution, becomes a dominant noise source when high fields are applied across narrow junctions, as is the case in deep-submicron devices. Finally, for fast SPADs, the total number of avalanches resulting from after-pulsing also increases with higher fields for the same reason outlined above.

After-pulsing follows a multi-exponential time distribution, depending on the lifetimes of traps involved. Because the released carriers may trigger a false avalanche that is not the result of an impinging photon, it is imperative to reduce the probability that such events occur. This can be done by ensuring that the device is biased below its breakdown for a sufficiently long time following an avalanche, such that only a negligible residual trap population remains filled for the next detection window. This results in a dead time during which photons cannot be detected, and is the minimal time between consecutive avalanches. Because trap lifetime is inversely proportional to temperature, cooling the device only exacerbates this noise. Dead time limits the fastest phenomena which can be measured in fluorescence correlation spectroscopy, determines the total acquisition time for 3D imaging applications using SPADs and sets the saturation level in photon counting applications.

In order to maximize timing precision in SPADs, their junction area must be minimized. This reduces the uncertainty in the position of the avalanche generation within the junction, which in turns reduces the uncertainty in delays between the photon arrivals and avalanche detections. An added benefit of smaller junctions is their reduced noise: trap-assisted and direct tunneling currents are linearly proportional to the junction area, while after-pulsing depends on junction capacitance.

The small capacitance, down to 30 fF in our SPADs also results in a reduced dead time. A 7 μm-diameter SPAD using the STI guard-ring exhibits a 3 ns dead time, the shortest reported to date. However, this short dead time does not leave sufficient time for some traps to be released, resulting in an unacceptable after-pulsing rate at room temperature. When heated, the dark rate drops significantly, indicating that after-pulsing is responsible. However, at higher temperatures trap-assisted tunneling becomes dominant.

An active-recharge circuit can be designed to alleviate this problem, making it possible to operate at higher voltages, thus achieving higher detection efficiencies, while reducing the dark current. Unlike conventional active-recharge circuits, which are designed either to reduce the dead time of the device or to improve its timing precision, this active recharge circuit aims to reduce after-pulses and increase the attainable detection efficiency. It should preferably not significantly increase the device dead time, so that the benefits of the small geometry are not relinquished, so it must perform its processing and feedback within approximately 3 ns—the dead time of the passive device. This can only be achieved by using fast transistors in close proximity to the diode. Moreover, such a circuit should not impinge on, and should preferably improve upon the quenching behavior of the SPAD. Lastly, a compact and noise-free design is desirable so that these structures can be incorporated into multi-pixel arrays.

In passive quenching, a voltage is applied across the diode through a resistor. As an avalanche forms, the current through the resistor rises and a voltage builds across it, resulting in a lower bias across the diode, thus quickly quenching the avalanche. Immediately after completion of the quenching, the diode capacitance, in addition to any parasitics, are recharged through the same resistor, with a time constant $R_q(C_d+C_p)$, where $R_q$ is the quenching resistance, $C_d$ is the depletion region's capacitance and $C_p$ is any parasitic capacitance on the diode node. If the quenching cannot be achieved on the same die as the SPAD, a large parasitic capacitance, on the order of a few picofarads results. Consequently, the dead time increases, and the photon-counting rate is reduced. Moreover, because of the gradual charging of the diode, the overbias varies within the exposure time, resulting in varying detection efficiencies.

Figure 8:
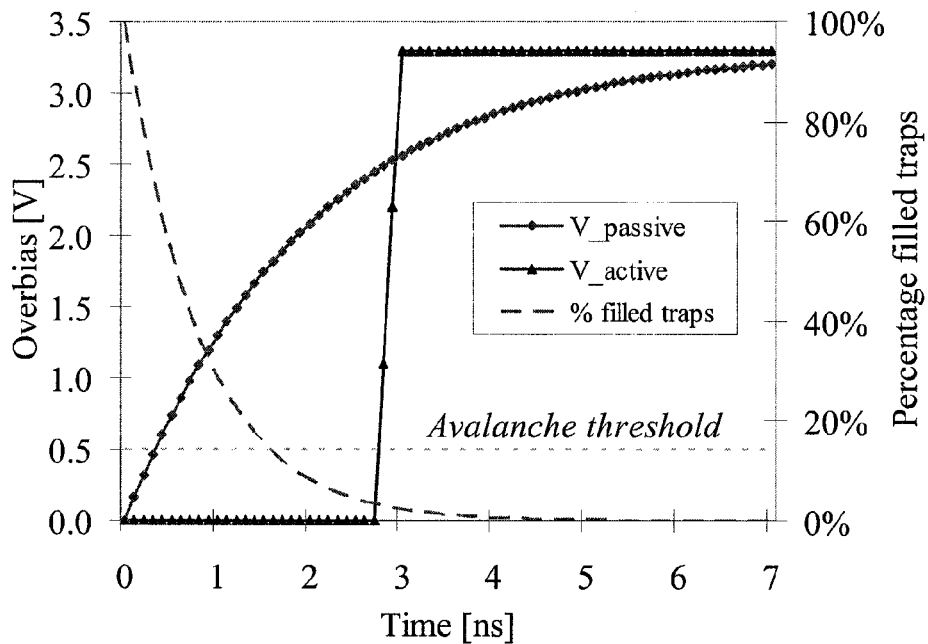
FIG. 8 shows passive and active recharge waveforms, wherein, with active quenching, breakdown can occur only after most of the traps have been released.

An active recharging scheme can improve these issues. Its effect is shown in FIG. 8. With passive quenching, the SPAD can after-pulse almost immediately after it has been discharged, yet it only achieves its full overbias (and corresponding optimal detection efficiency) after a long delay. A desired active recharge scheme will silence the detector for the duration of the dead time, and will instantaneously recharge it. This will allow trapped charges to be released without inducing after-pulses, and will ensure a binary ON or OFF operation. The effect should reduce the primary after-pulses, i.e., those directly resulting from the initial pulse, as well as prevent the formation of secondary after-pulses generated by the primary ones.

Figure 9:
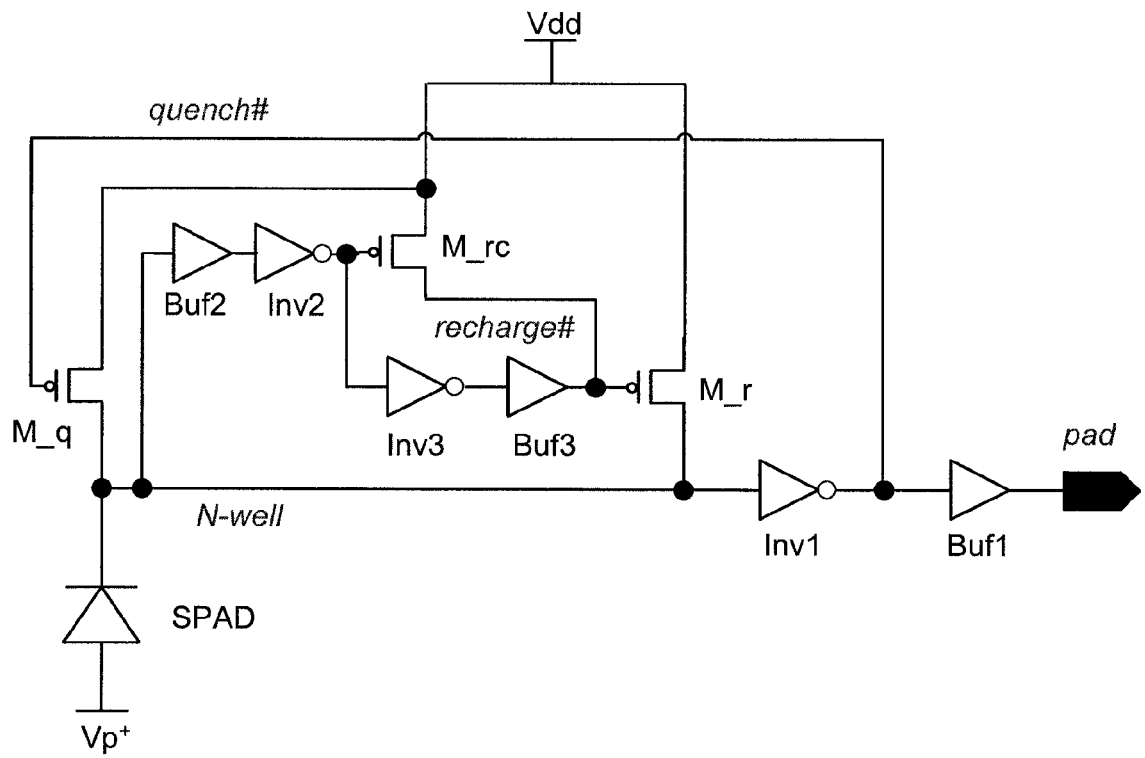
FIG. 9 shows an example of an active recharge circuit.

FIG. 9 shows an example of a compact self-timed actively-recharged circuit which can be incorporated into various SPAD devices including SPAD arrays. This active recharge circuit is electrically coupled in series to the p-n junction of the SPAD to control quenching and recharging the p-n junction in the avalanche ionization process. The active recharge circuit includes a quenching transistor M_q whose source or drain (e.g., drain in this example) is electrically connected to the p-n junction, the quenching transistor being electrically controlled to exhibit the large resistance that prevents the breakdown of the pn junction during the avalanche process. A recharge transistor M_r is included and is electrically connected to the p-n junction. A control circuit including a control transistor M_rc is electrically coupled to the quenching transistor and the recharge transistor in response to a sensing voltage at the p-n junction (e.g., the N well). The recharge transistor is electrically controlled to exhibit a small resistance less than the large resistance of the M_q and is connected to the pn junction when the pn junction is in the recharging phase when the M_q is turned off. In the active-quenched pixel, the quenching resistor found in the passive pixel, which also serves for recharging the diode, is replaced by two active resistors. A PMOS quenching transistor, M_q, with a high "on" resistance, $R_{quench}$=1.2 MΩ ensures fast avalanche quenching with minimal leakage current during non-quenching times. A second, smaller transistor, M_r, is used for an ultra-fast recharge, with $R_{recharge}$=24 kΩ.

In order to ensure a constant detection efficiency throughout the detection cycle and in order to minimize after-pulsing, the diode is kept below its breakdown voltage from the time the avalanche has been quenched until most of the trapped charges are released. It should subsequently be quickly recharged, e.g., through a low resistance. However, this low impedance must be disconnected immediately upon completion of the recharge because at that instant the device is ready to fire-off upon absorption of a photon, but has insufficient resistance to fully quench an avalanche.

Figure 10:
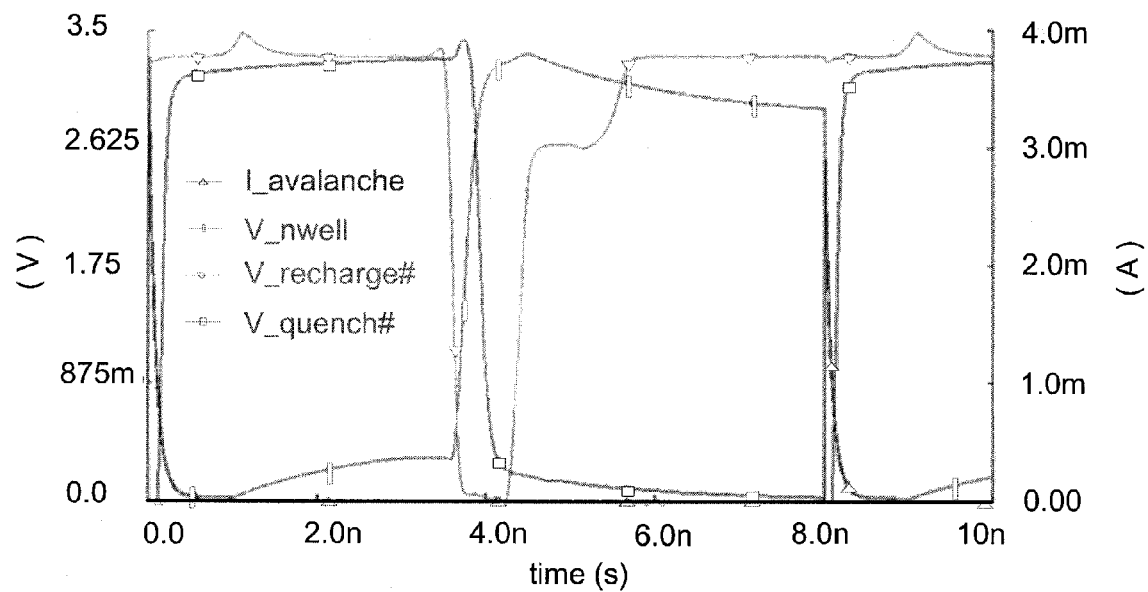
FIG. 10 shows simulation results of an active-recharged SPAD cycle for the circuit in FIG. 9.

FIG. 10 shows simulation results of an active-recharged SPAD cycle for the circuit in FIG. 9 and the circuit operation. At the beginning of a sensing phase, M_q is in the linear region (quench# is low) and M_r is cut-off (recharge# is high), with $R_{M\_r,OFF} > R_{M\_q,ON}$. When a photon arrives and an avalanche builds up, the junction capacitance quickly discharges the N-well node and the avalanche is quenched due to an IR drop across M_q. As the N-well voltage drops, M_q moves to saturation and is quickly cut-off by the sensing inverter, Inv1 (quench# goes low). This reduces the leakage current through it and in essence freezes the voltage across the junction, so that traps can be emptied without inducing an avalanche. After a longer delay, which is set by Buf3 (based on the expected trap lifetime), M_r is switched to its saturation region through M_rc (recharge# goes low), and the diode quickly recharges through the small recharging resistance. When recharging is almost complete, M_r moves to the linear region and the quenching transistor M_q is turned on (quench# low). As discussed above, the recharging time must be kept short, and as soon as the excess voltage is attained, the small resistance must be quickly disconnected. This is achieved by Buf2 and Inv2, which turn M_rc on, resulting in the cut-off of M_r.

Notably, the circuit in FIG. 9 is a digital block to avoid issues with analog circuit operations and uses a simple signal source follower in sensing the voltage at the N well and a simple buffering design in controlling the time delay in the timing the two operating phases of one detection cycle without using a clock or other timing circuitry. The circuit simulation shows two discrete SPAD bias levels, corresponding to the desired binary sensitivity states. A dead time of 3 ns was targeted for a significant reduction in dead counts compared with a passively-quenched device having similar detection efficiencies.

A prototype circuit based on the design in FIG. 9 was made by using an IBM 0.18 μm CMOS process, and measures 44 μm per side, 13 times smaller than the some reported compact active-recharge circuit to date. We first evaluated the dead-time performance of the actively-quenched SPAD by operating it at room temperature with a high over-bias, forcing a high dark count. The device output was measured using a Tektronix TDS 3032 oscilloscope, with discernible peaks separated by 3 ns, in agreement with our simulations. This corresponds to a 3 ns dead time—three times faster than the shortest actively-recharged dead time reported to date.

Figure 11:
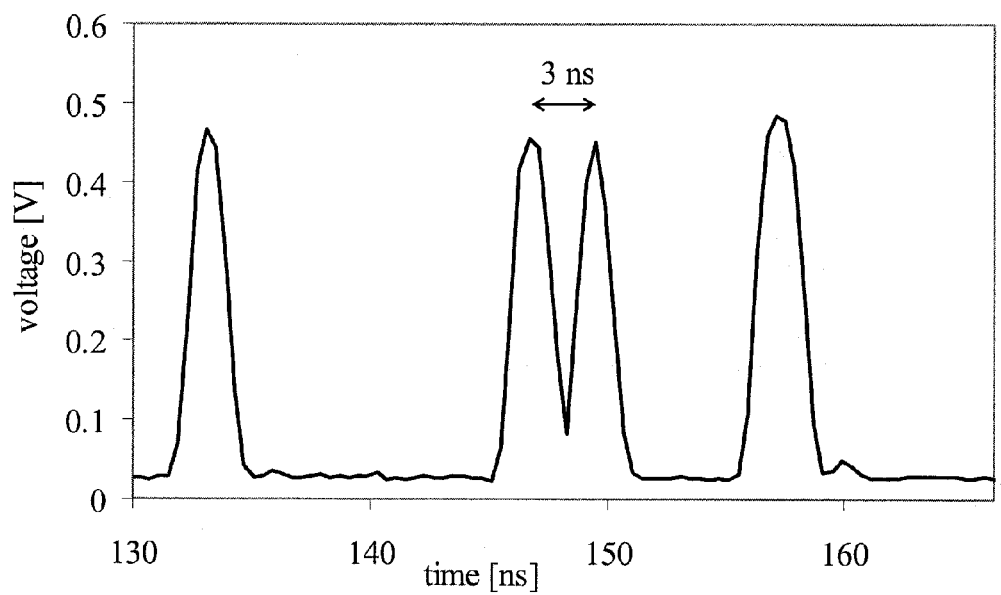
FIG. 11 shows an oscilloscope image of SPAD output with 3 ns dead time in a prototype circuit based on the design in FIG. 9.

FIG. 11 shows an oscilloscope image of SPAD output with 3 ns dead time in a prototype circuit based on the design in FIG. 9. After-pulsing, unlike other noise sources, decreases with increasing temperature. In order to confirm whether after-pulsing is indeed the dominant noise source, we measured dark counts versus temperature for a passively-quenched SPAD, using a Becker-Hickl MSA-1000 counter. Junction temperature was measured using a resistor with a large temperature coefficient, which was fabricated in close proximity to the diode.

Figure 12:
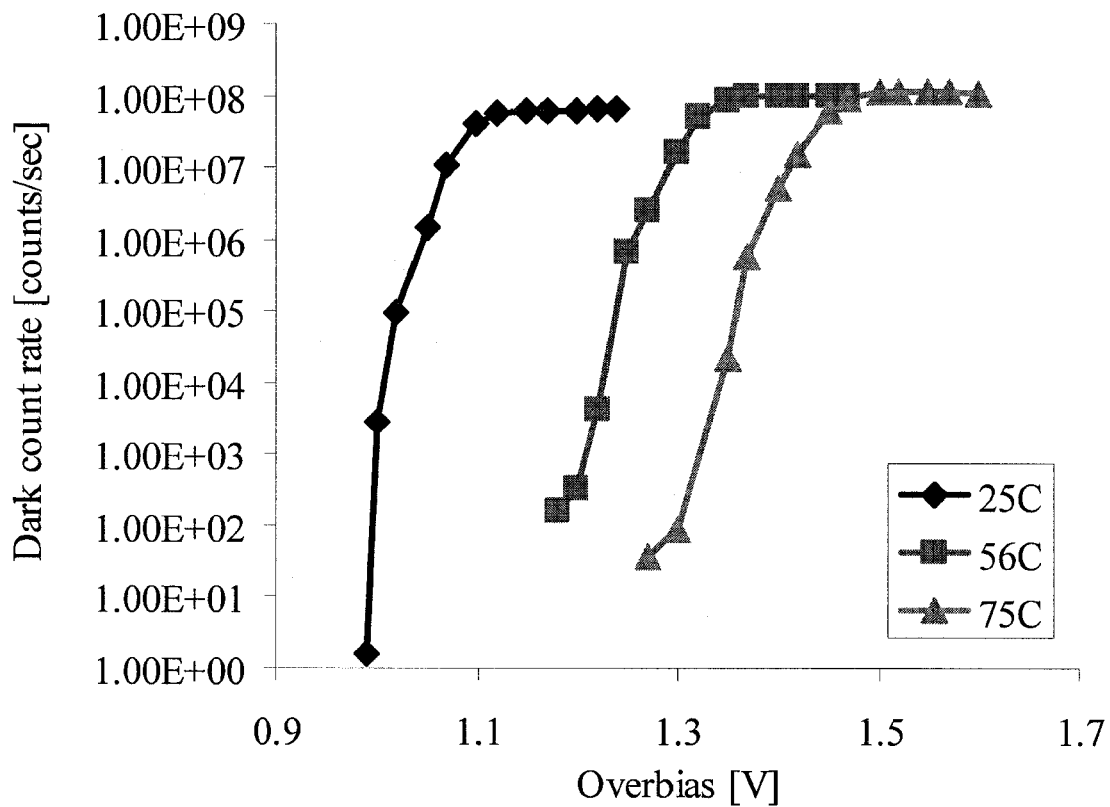
FIG. 12 shows temperature dependence of dark counts for a passively-quenched SPAD.
Figure 13:
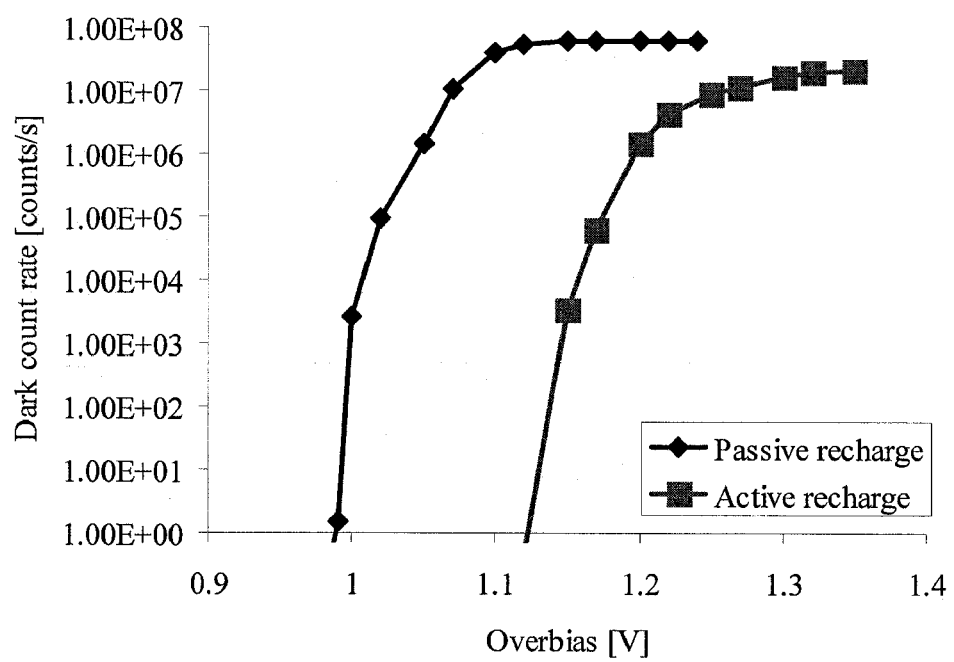
FIG. 13 shows dark count rates for identical diodes with passive and active recharging at 25C.

Our results, as shown in FIG. 12, demonstrate a decrease of more than five orders of magnitude in dark counts for a 20 degree temperature increase, as would be expected from an after-pulse-dominated signal. In order to gauge the effectiveness of the active-recharge circuit, we compared the dark count rates of two identical SPADs, one having a passive recharge circuit and the other actively recharged. The results, shown in FIG. 13 demonstrate a significant improvement in dark counts with the new circuit. A 1V overbias results in 10,000 dark counts per second in the passively-recharged device, yet the actively-recharged device can operate with a 120 mV higher overbias with the same dark count. Moreover, the passively-recharged SPAD saturates at 1.1V while the actively-recharged one can operate up to 1.28V. The higher operating voltage resulting in a higher electric field should produce an increased detection efficiency.

Finally, we measured the detection efficiencies of the diode with the two recharging schemes. A Becker-Hickl BHL-600 laser illuminated the devices at 635 nm with 50 ps pulses at a 20 MHz repetition rate. Using a calibrated New Focus 2031 photodiode as a reference, we attenuated the photon flux to 0.35 photons per pulse. The laser's electrical trigger served as the "Trigger" channel input of an MSA-1000 and the SPAD output was fed to the "Signal" channel of the counter. Histograms were collected for dark and illuminated devices with passive and active quenching under the same temperature and bias conditions.

Figure 14:
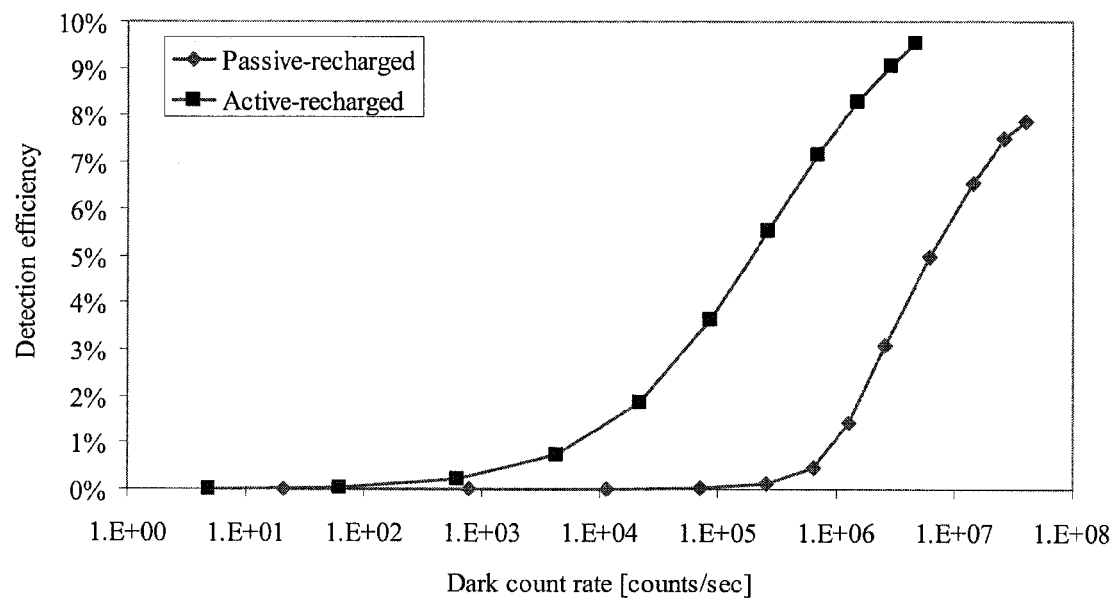
FIG. 14 shows detection efficiency versus dark count rate for a passively- and an actively-recharged SPAD with 635 nm illumination.

A plot of the detection efficiency versus the dark count rate, shown in FIG. 14, demonstrates the efficacy of the new recharge scheme. It makes it possible to achieve identical detection efficiencies as in a traditional passive recharge scheme, with only 1-3% of the dark counts. Similarly, if we would like to operate with a maximal dark count of $1 \times 10^6$ counts per second, after-pulse suppression using the new circuit makes it possible to improve detection efficiencies from 1% to 7.8%, with a similar improvement factor in shorter wavelengths where the device is more sensitive. At this regime, time-gated operation should be used in order to only collect signal pulses. Based on our theoretical calculations and the performance of a SPAD with a similar junction depth, we expect our device's detection efficiency to peak at 450 nm, with a three-fold higher efficiency than at 635 nm.

Figure 15A:
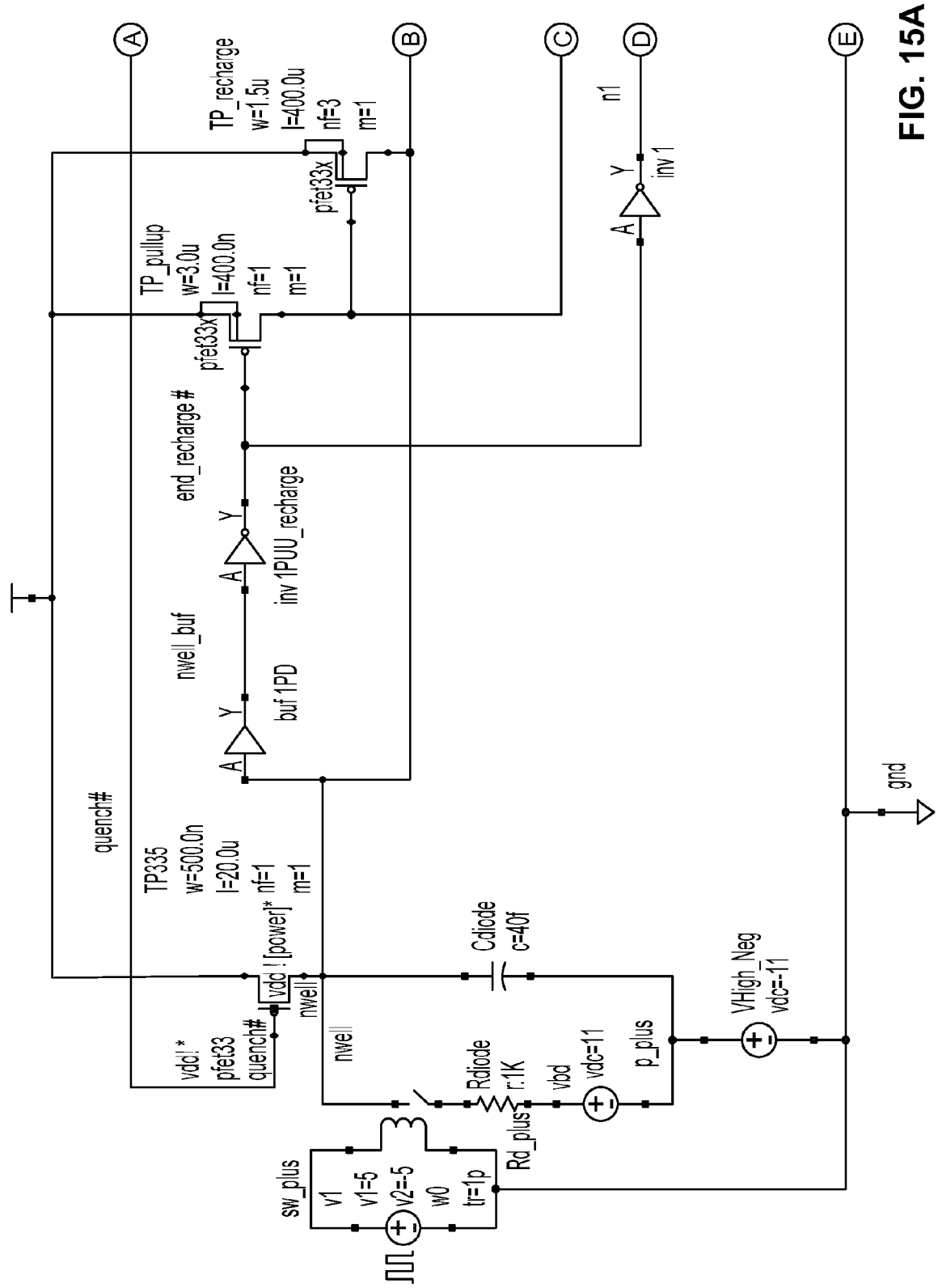
FIGS. 15A-15B show a detailed layout of an active recharge circuit design based on the design in FIG. 9.
Figure 15B:
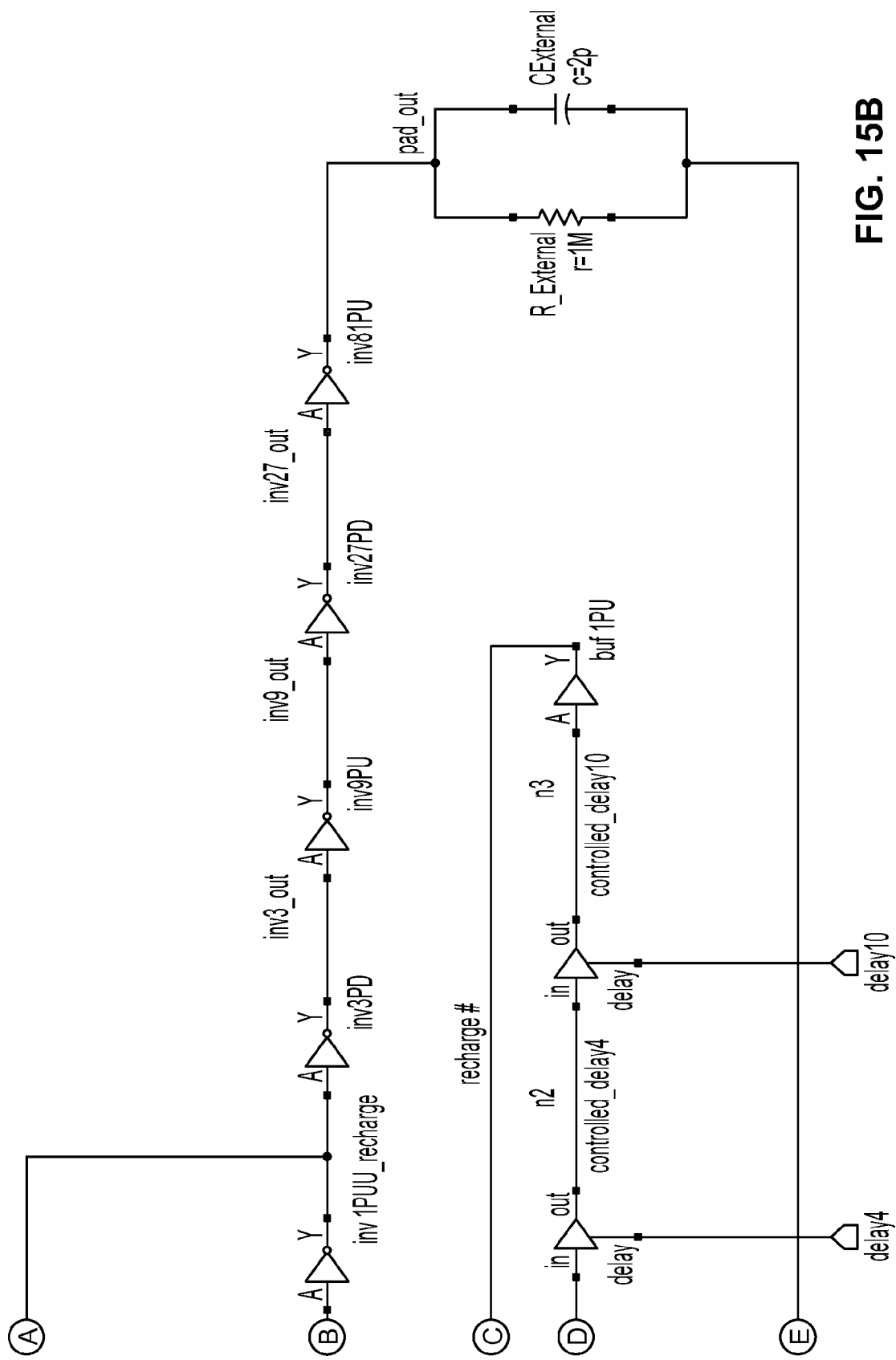

FIGS. 15A-15B show a detailed layout of an active recharge circuit design based on the design in FIG. 9.

Therefore, the active recharging design in FIG. 9 can significantly reduce after-pulsing—a major obstacle for continued miniaturization of high-speed single photon avalanche diodes. The circuit includes digital-only blocks and utilizes the high speed of a commercial 0.18 μm which was also used to fabricate the SPAD on the same die, resulting in a 3 ns dead time, three times shorter than the state of the art. Experimental results indicate 97%-99% reduction in dark counts and a 7.8-fold increase in detection efficiency for a given dark count rate. The new scheme can be scaled to multi-pixel arrays and should enable unprecedented resolutions in biological applications, as well as vast improvements in acquisition times for 3D images.

Referring back to FIGS. 2, 3 and 4, each SPAD device includes two pn junctions that are vertically-colocalized. In these examples, the two junctions are a p+ drain/N-well junction and an N-well/p-substrate junction. Since the latter junction is significantly deeper than the shallow former junction, and because shorter wavelengths are much more likely to be absorbed close to the silicon surface due to their higher absorption coefficient, by applying proper voltages on these layers and by designing appropriate detection circuitry, one can simultaneously detect and distinguish between the absorption of short wavelength photons (in the shallower junction) and longer wavelength photons (in the deep junction). This ability renders itself for techniques such as Fluorescence Cross-Correlated Spectroscopy, whereby two molecules can be co-localized by analyzing the photon emissions from different fluorophores attached to each, in response to excitation from one or more light sources.

Figure 16:
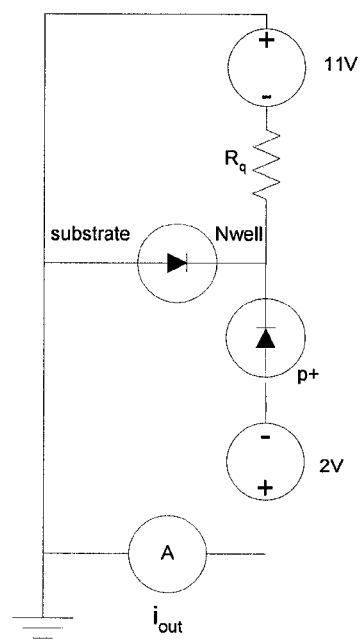
FIG. 16 shows an example of a dual-wavelength cross correlated SPAD device.

Referring specifically to FIG. 2, as an example, the $p^+$-Nwell junction and the Nwell-substrate junction of FIG. 1, are both biased above breakdown. Under proper bias, both breakdowns can be observed simultaneously and distinguished. Referring to FIG. 16, an avalanche breakdown in the shallow junction will involve the flow of electrons from the $p^+$ region to the N-well, and an avalanche in the deeper junction will involve flow of electrons from the substrate to the N-well. Holes will flow in the opposite direction. If an ammeter is placed such that it measures the flow of charge from the $p^+$ terminal to the substrate, a positive signal will result from an avalanche in the shallow junction and a negative signal will result from and avalanche in the deep junction.

In deep sub-micron technologies, the breakdown-voltage of these two junctions are similar, for example 11V and 10V for the two above-mentioned junctions, respectively. Referring to FIG. 16, the substrate is grounded, the N-well is connected to 11V through a quenching resistor, and the $p^+$ is connected to −2V. The shallower junction ($p^+$-N-well) is then reverse-biased at 13V while the bottom junction is reverse-biased at 11V. Certain technologies (known as "triple-well" processes) allow for a deep N-well to be formed. Such an implant can be used in implementing the present SPAD design. The triple-well process is not required for implementing the present SPAD design.

Figure 17A:
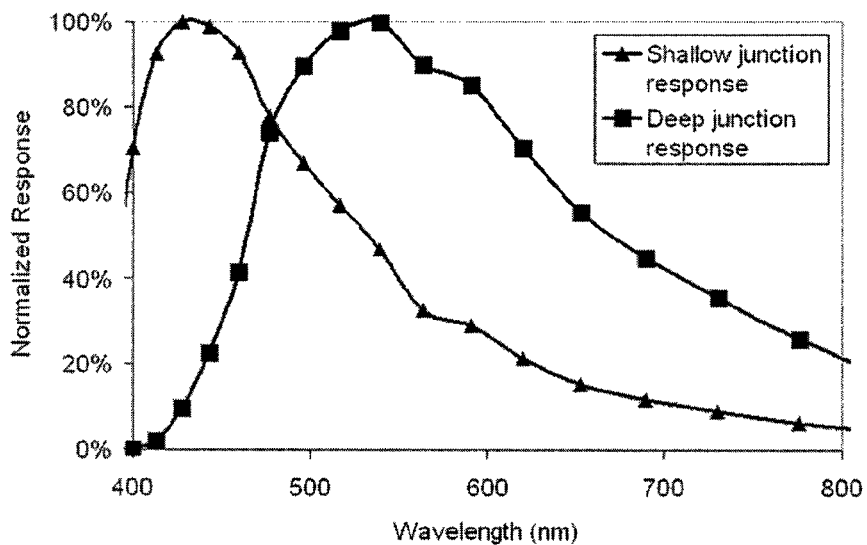
FIGS. 17A and 17B illustrate the wavelength responses of shallow and deep pn junctions in SPAD devices.
Figure 17B:
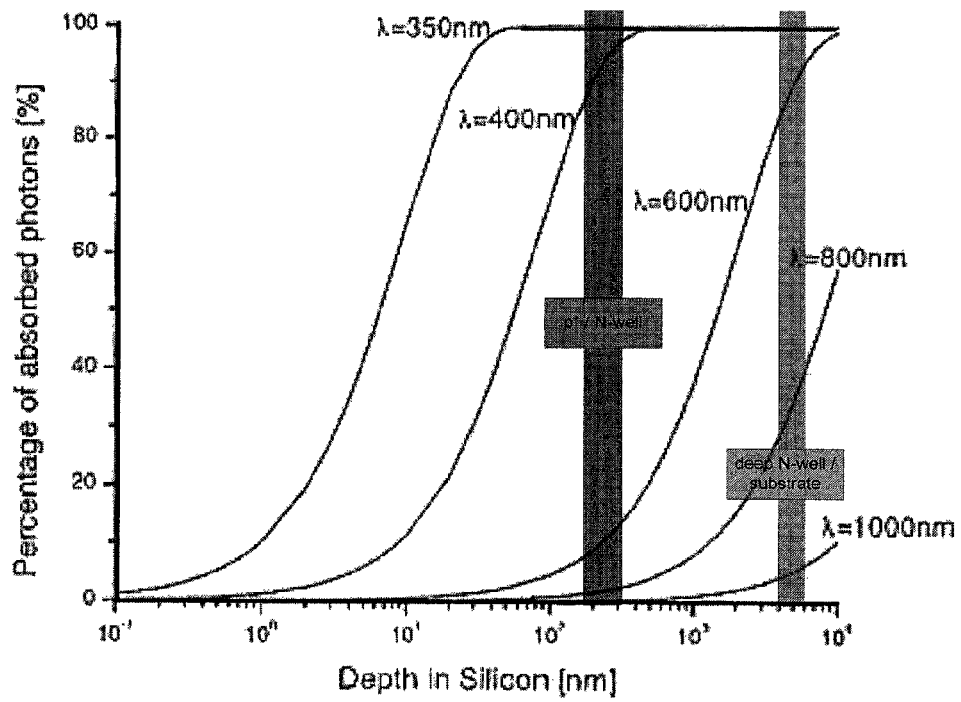

The p$^+$-Nwell and Nwell-substrate junctions will absorb photons with different wavelength with different absorption probabilities. FIGS. 17A and 17B illustrate the wavelength responses of shallow and deep pn junctions in SPAD devices. For example, if the shallower junction is located 0.2 μm below the surface and the deeper junction is located 1.5 μm below the surface, and assuming that the depletion layer depths for the two junctions are 200 nm and 2 μm, respectively, then a photon of wavelength 400 nm will be absorbed in the shallow junction with a probability of approximately 15%. The same photon will have a probability of less than 0.1% of getting absorbed in the deep junction. A photon of wavelength 1000 nm, will have a negligible probability of being absorbed in the shallow junction but a 5% probability of being absorbed in the deep junction. If two particles, one fluorescing at 400 nm and the other at 1000 nm are attached to each other, e.g., through a chemical reaction, the device will output a correlated signal, comprised of the avalanches caused by the two particles. For a SPAD device, the deep junction alone, the shallow junction alone or a combination of the shallow and deep junctions may also be used for sensing applications.

Figure 18:
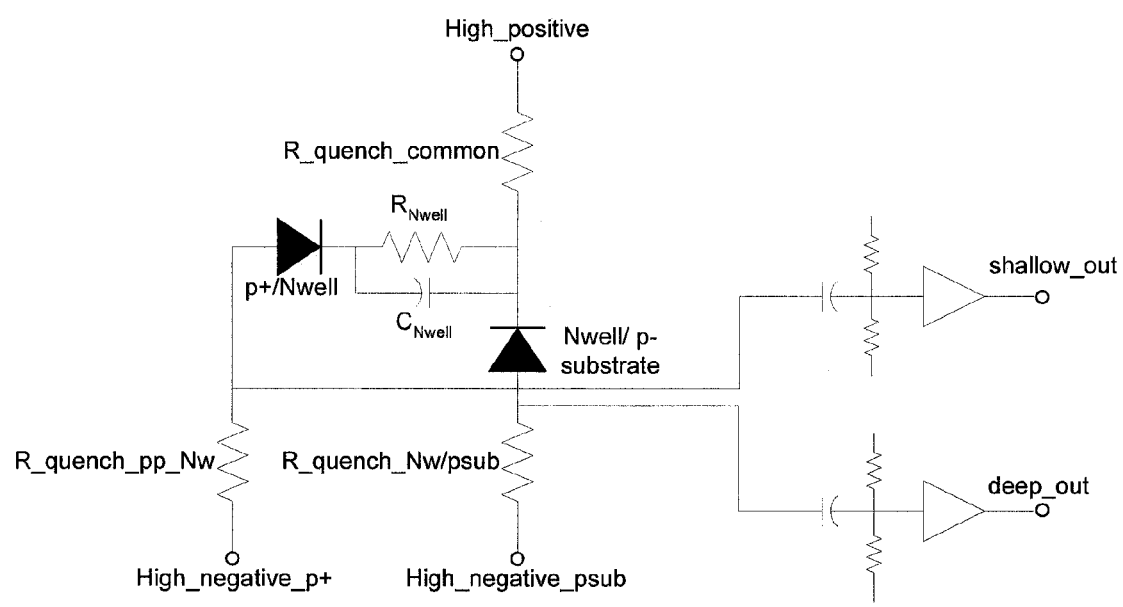
FIG. 18 shows an example of a dual-wavelength SPAD device with readout circuitry, where the SPDA can be a SPDA with a guard ring at a pn junction or a SPDA in other designs.
Figure 19A:
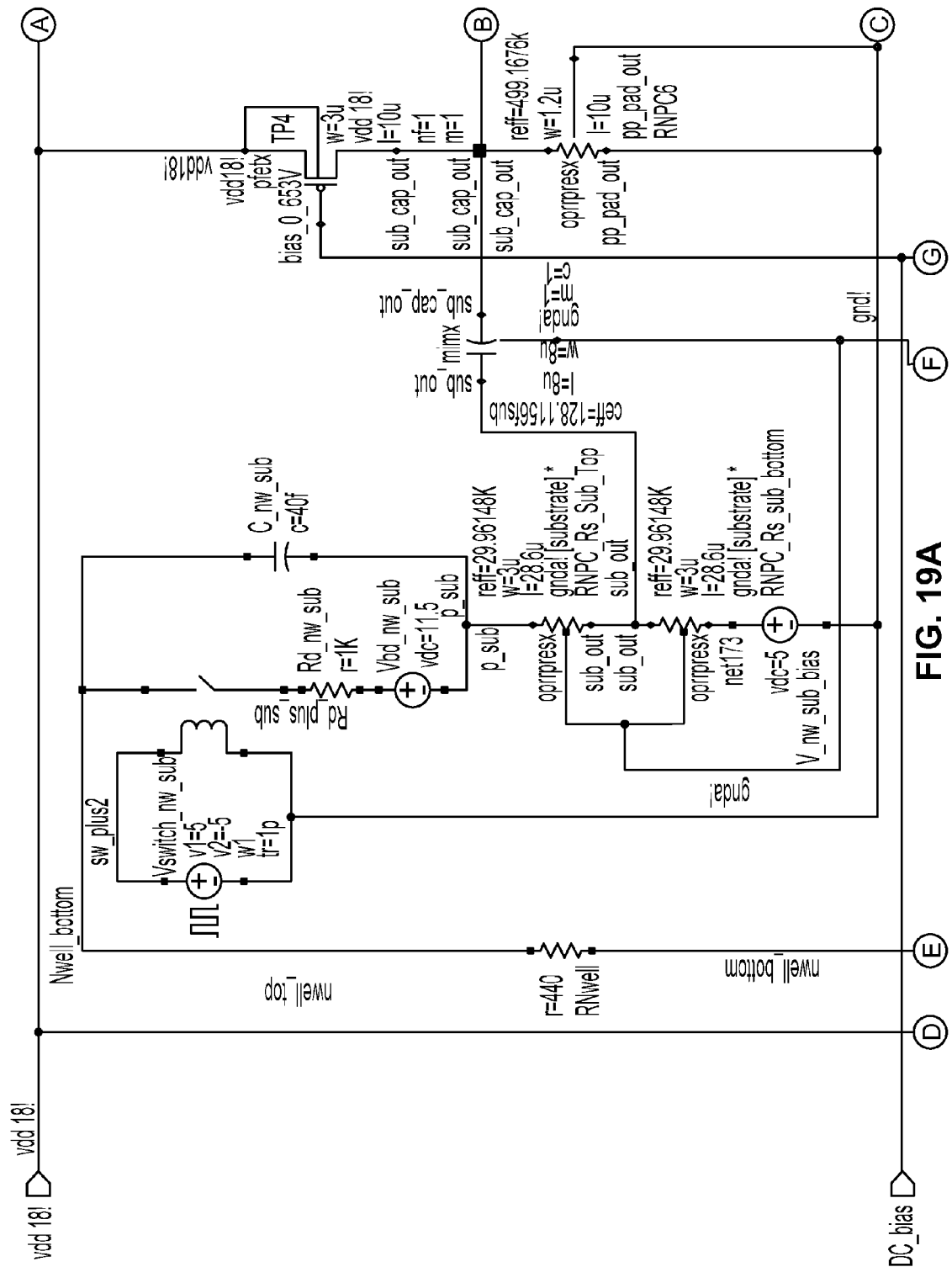
FIGS. 19A-19D show an example of a detailed layout of a dual color SPAD device with readout circuitry.
Figure 19B:
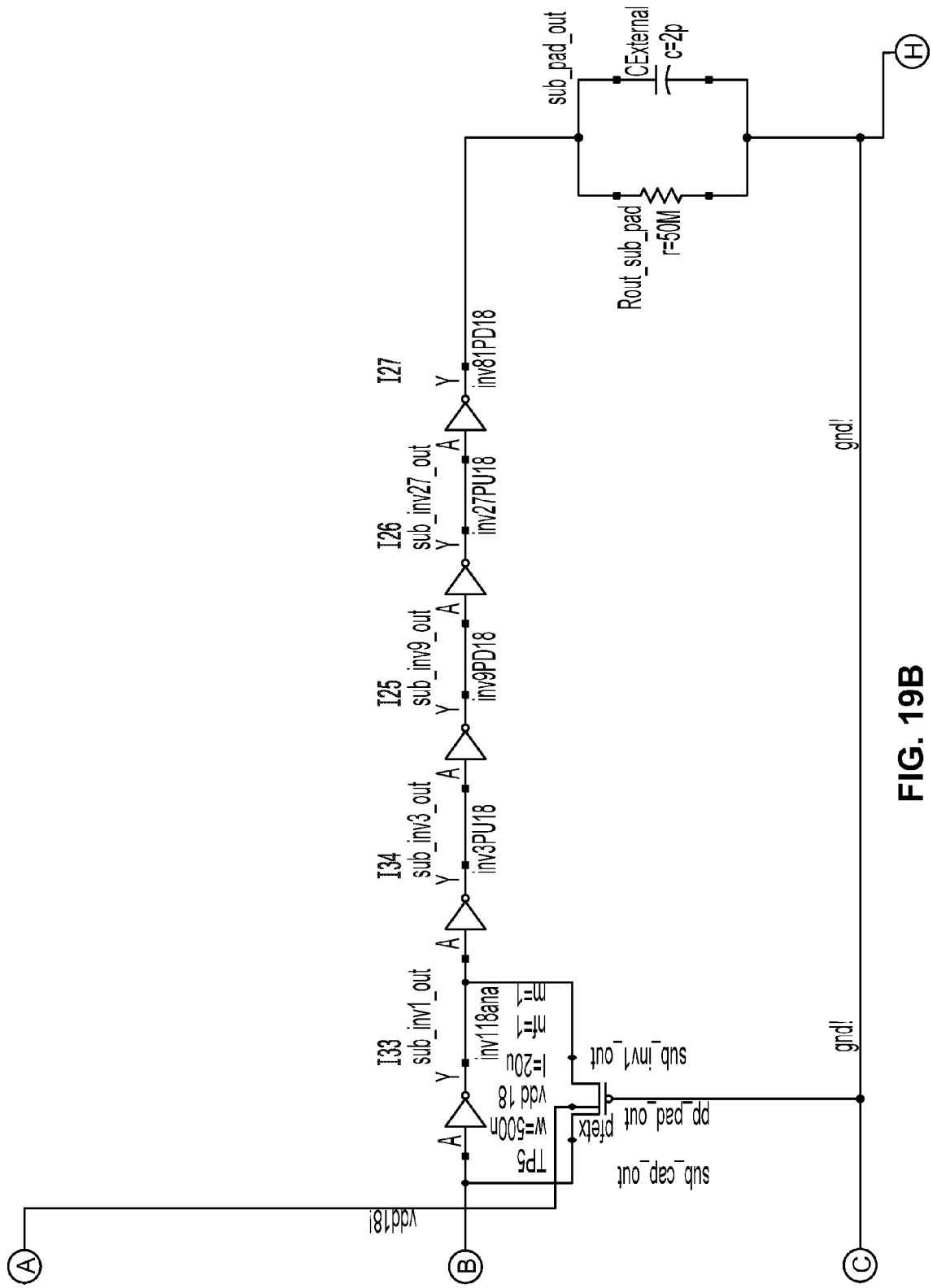
Figure 19C:
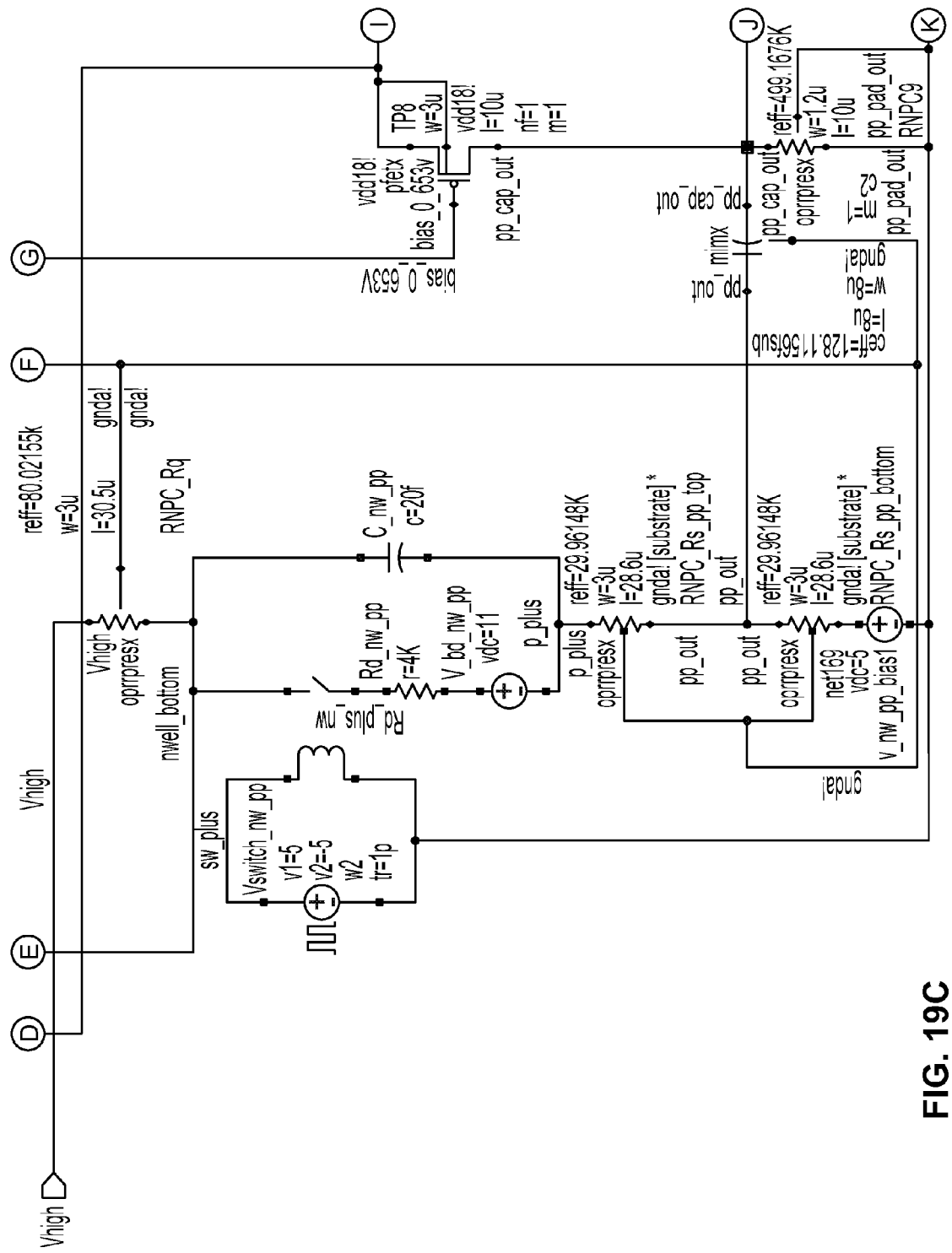
Figure 19D:
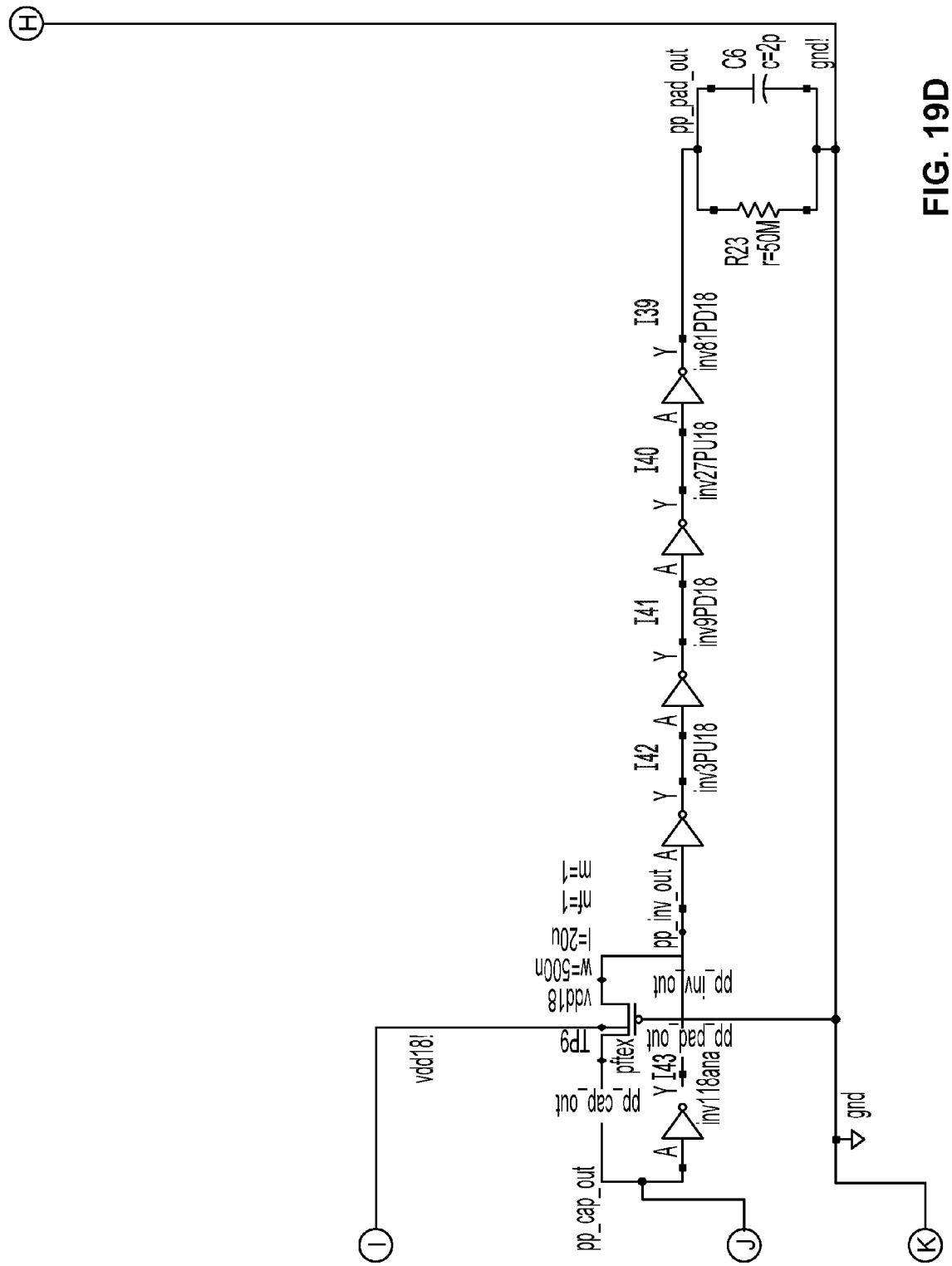

FIG. 18 shows an example of a dual color SPAD device using a guard ring SPAD or a SPAD based on other designs. In this example, a detector circuit is electrically coupled to the shallow region of the first type conductivity, the well region of the second type conductivity and the substrate region of the first type conductivity to bias the shallow p-n junction in a Geiger mode to detect light at a first wavelength, and bias the deep p-n junction in a Geiger mode to detect light at a second wavelength that is shorter than the first wavelength for light entering the device from the top substrate surface. The detector circuit includes a first quenching resistive element electrically coupled in series to the shallow region of the second type conductivity of the shallow p-n junction to produce a first large resistance that makes a voltage across the shallow p-n junction to be less than a breakdown voltage of the shallow p-n junction during an avalanche breakdown process caused by absorption of a photon at the first wavelength in the shallow p-n junction. A second quenching resistive element can be included in the detector circuit and is electrically coupled in series to the substrate region of the first type conductivity of the deep p-n junction to produce a second large resistance that makes a voltage across the deep p-n junction to be less than a breakdown voltage of the deep p-n junction during an avalanche breakdown process caused by absorption of a photon at the second wavelength in the deep p-n junction.

The detector circuit can include two readout circuits: a first readout circuit electrically coupled to the shallow region of the first type conductivity to read out an output from the shallow p-n junction indicative of detected light at the first wavelength; and a second readout circuit electrically coupled to the substrate region of the first type conductivity to read out an output from the deep p-n junction indicative of detected light at the second wavelength. In the example in FIG. 18, the first readout circuit includes a first high-pass filter electrically connected in series to the shallow region of the first type conductivity; and a first voltage divider electrically connected to the first high-pass filter to produce a first readout signal. The second readout circuit includes a second high-pass filter electrically connected in series to the substrate region of the first type conductivity; and a second voltage divider electrically connected to the second high-pass filter to produce a second readout signal.

FIGS. 19A-19D show an example of a detailed layout of a dual color SPAD device with readout circuitry.

False correlation counts for a dual color SPAd device may result from:

1. Short-wavelength photons being absorbed in the deep junction or long wavelengths being absorbed in the shallow junction: the probability of this happening is less than 15%× 0.1%=0.015%.

2. Dark pulses created within a short time interval of each other: to calculate the probability for this occurrence, assume the dark current rate in both junctions is 1000 counts/sec and correlation is defined as pulses being recorded within 100 nsec of each other. The probability of no pulses in a junction within 100 nsec is $$P(N=0) = \frac{\alpha^k}{k!}e^{-\alpha} = \frac{(1000 \times 100 \times 10^{-9})^0}{0!}e^{-(1000 \times 100 \times 10^{-9})} \quad [32]$$

and the probability for at least one pulse will be 1−P(N=0) =9.9995×10$^{-5}$. Since dark current is assumed to be generated independently, the probability for two pulses occurring within this interval is negligible (1×10$^{-8}$).

3. Inter-junction cross-talk: this results from charges generated by an avalanche from one junction drifting to the depletion region of the other junction, generating an avalanche there. Time gating can be used to rule out such events.

The device can be used in Fluorescence Cross-Correlation Spectroscopy applications, where synchronous movement of two biomolecules with different fluorescence labels is detected.

The SPAD jitter is an important parameter and the measurement is often done by using a measurement circuit outside the SPAD device. Such external circuitry for jitter measurement can cause various errors that compromise the accuracy of the jitter measurement. This technical issue arises more generally in jitter cross-correlation between two identical, independent Gaussian jitter sources. A common limitation of characterization setups for SPAD devices is their inability to measure the timing accuracy of the device. Various on-chip jitter measurement schemes are complicated and require PLL-like (Phased-Locked-Loop) circuitry, including an accurate reference voltage controlled-oscillator, a phase detector and additional logic circuitry. These schemes are complicated in part because of their need to measure absolute jitter. Other schemes which measure the pixel jitter outside the chip require expensive setups and provide an overall jitter which is comprised of the illuminating laser's jitter, the actual pixel's setup, the cable assembly jitter and the measurement equipment's uncertainty.

The present specification provides a method to measure the cross-correlation between two jitter-generating pixels, which can be assumed to be identical and independent. A logic signal is captured inside the chip, depending on the timing relationship between the pulses generated by the two pixels. This logic signal can be read out from the chip using a low-frequency interface, thus preventing any loss of information. By collecting a histogram of such logic signals, the cross-correlation and therefore the actual distribution of the jitter of each pixel can be calculated. This scheme utilizes only a variable-delay line and a sampling D flip-flop, is much easier to implement and is less costly in real-estate than some other methods for measuring the cross-correlation between two jitter-generating pixels.

Figure 20:
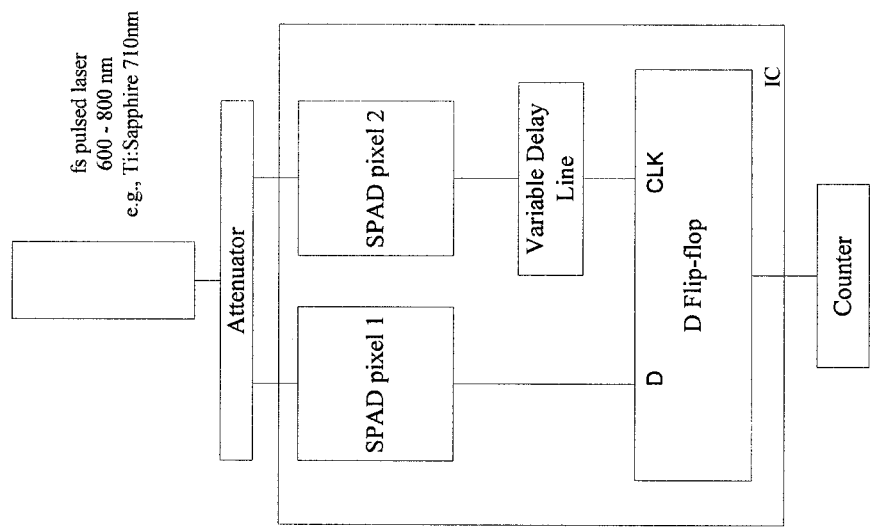
FIG. 20 shows an example of an on-chip jitter measurement circuit which measures the jitter of a SPAD pixel.

FIG. 20 shows an example of an on-chip jitter measurement circuit which measures the jitter of a SPAD pixel. This design can provide jitter measurement without requiring expensive and relatively noisy measurement equipment or driving external circuitry at speed (which also introduces added jitter). In addition to measuring the jitter of the described SPAD device with the STI guard ring, this scheme can also be used for jitter measurement of other SPAD devices and various independent Gaussian jitter sources, e.g., serial communication drive circuitry.

In the example in FIG. 20, a single photon avalanche diode (SPAD) device is shown to include a substrate; a first SPAD monolithically formed on the substrate; a second, separate SPAD monolithically formed on the substrate; and a D flip-flop circuit monolithically formed on the substrate and electrically connected to (1) the first SPAD to receive an output from the first SPAD at an data input of the D flip-flop circuit, and (2) the second SPAD to receive an output from the second SPAD at a clock input of the D flip-flop circuit. A variable delay line is also monolithically formed on the substrate and electrically connected in a signal path between the second SPAD and the clock input of the D flip-flop circuit to cause a delay.

To perform jitter measurements, a pulse laser source is used to illuminate the two adjacent SPADs on the chip. One SPAD output is fed to the Data input of the D flip-flop. The output of the second SPAD is fed through a variable delay line to the Clock input of the D flip-flop. A D flip-flop locks data only if the data arrives at least a certain time (setup time) before the clock. The following may occur:

1. Avalanches occur in both SPADs. SPAD A (which feeds the Data input) arrives at the flip-flop at least a setup time before SPAD B. The flip-flop captures a "1" which can be read out at low frequency.

2. Avalanches occur in both SPADs. SPAD A arrives at the flip-flop later than a setup time before SPAD B. The flip-flop does not capture a "1". If the flip-flop was reset to "0" before, this is the value which will be read.

3. Avalanches occur in both SPADs. SPAD A arrives at the flip-flop almost exactly a setup time before SPAD B. The flip-flop enters a meta-stable state and outputs either a "1", a "0" or an intermediate value ("X").

4. An avalanche only occurs in one of the SPADs. If the flip-flop was reset to "0" before, this is the value which will be read.

A reset cycle may be induced externally. The reset cycle can also intrinsically occur whenever a dark pulse is generated in SPAD B (and not in SPAD A—the probability of occurrence of 2 dark pulses simultaneously in the two SPADs is negligible). The typical dark count rate in commercial processes is less than 1000 per second. Therefore, if read-out of the flip-flop output occurs after an interval much shorter than 1 msec, and if laser pulses occur farther apart than 1 msec, then the flip-flop output will be automatically reset.

Figure 21:
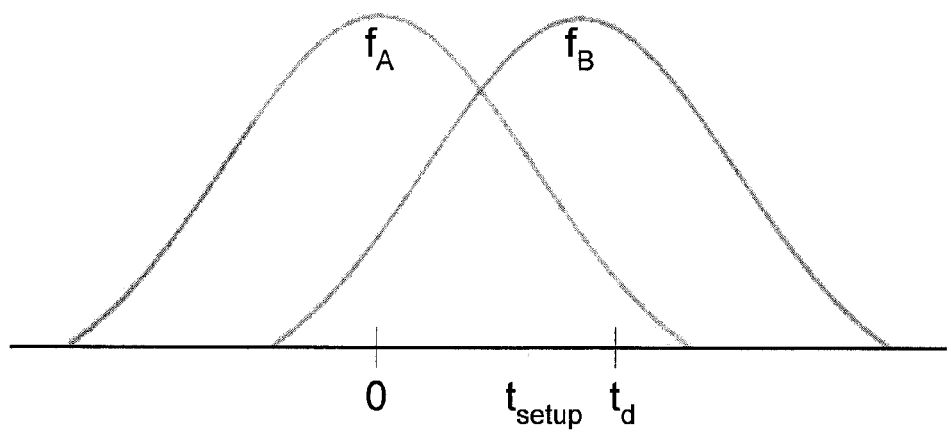
FIG. 21 shows histograms of pulse time of arrival at the D flip flop input.

FIG. 21 shows histograms of ulse time of arrival at the D flip flop input.

The SPAD's jitter can be obtained by varying the delay in the variable delay line and recording the percentage of "1"'s at the flip-flop output. If we define $f_A(t, \sigma, \mu)$ and $f_A(t-t_d, \sigma, \mu)$ to be the Gaussian distributions of the pulses' times-of-arrival for SPAD A and B, where $\sigma$ and $\mu$ are the standard deviation and median common to both distributions and td is the delay-line delay, then the proportion of "1"s at the output of the flip-flop for a sufficiently large sample size is the convolution $$\int_{t=-\infty}^{\infty} f_A(t) \int_{f_B}^{\infty} f_B(t' - t_d) dt dt'.$$

Figure 22:
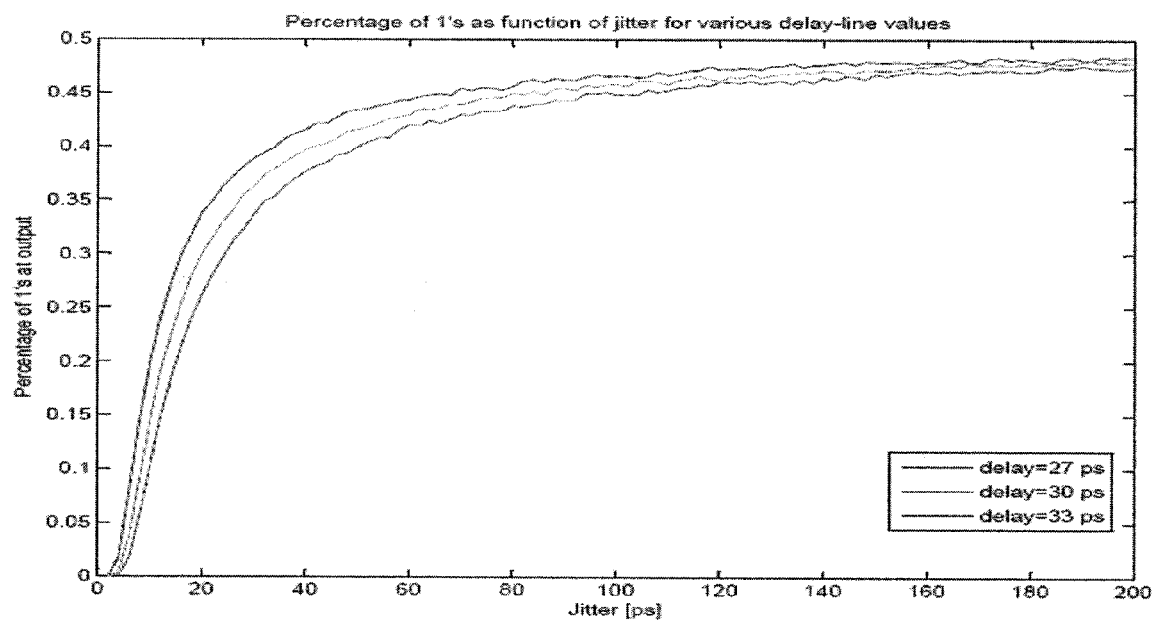
FIG. 22 shows the jitter output for "1" for various delays in the device in FIG. 20.

This value can be numerically evaluated for various values of delay to generate the plots of FIG. 22. These can be used to evaluate the SPAD's jitter with high accuracy.

Inaccuracies in the setup may be due to a number of factors, including:

1. Metastability of the flip-flop: when approaching the setup time of the flip-flop within a certain range, the output is not deterministic.

2. Variation of setup time with temperature and supply voltage drift or noise.

3. Variation of delay-line delay with temperature and supply voltage drift or noise.

These are independent so the total inaccuracy will be the square root of the sum-of-squares of these components. FIG. 22 shows simulated results with an assumed inaccuracy of ±3 ps of a 30 ps typical setup time.

The same scheme can be used to cancel the effect of dark current in certain applications. If the light flux is sufficient to simultaneously excite two adjacent pixels, then the output of these pixels can be fed to a D flip-flop as above. The D flip-flop output can serve as a "valid" bit for the SPAD data, i.e., if an avalanche has been generated due to a thermally-generated avalanche, a "0" will be read out. This can be useful in certain ladar applications.

SPAD devices can be used in a wide range of applications by using various outputs from the SPDA measurements. In low-light-level imaging, the avalanche event is read out and the time-density of avalanches, as read by a counter, determines the light flux impinging on the detector. In 3D ranging, the time of arrival of the photon, which is correlated to the precise time of the avalanche, is compared to the illuminating laser pulse's leading edge. A time-to-digital converter can be used to determine this time precisely. In 3D mapping, both the time-density and precise time-of-arrival can be used. In Fluorescence-Correlated-Spectroscopy, the auto-correlation of the times-of-arrival sequence is obtained. In Time-Correlated Single-Photon Counting, the time-varying time-density function is used for differentiating between fluorophores and noise.

There are diverse potential applications of the described SPAD structure with a STI guard ring, including (1) biological applications in fluorescent imaging, such as lifetime fluorescence imaging (FLIM), time-correlated single-photon counting (TCSPF), correlated fluorescence spectroscopy (CFS) and cross-correlated fluorescence spectroscopy (CCFS); (2) 3D imaging for biometric and industrial applications, such as face recognition, robotic warehouse vision, and others; (3) Military: Time-gated imaging, e.g., imaging of hidden objects behind canopies; (4) Ladar; (5) Low light-level imaging; (6) Semiconductor defect analysis; and (7) UV detection in spark alarm systems. In addition the built-in jitter measurement scheme can be used to lower the price of characterization and design validation of high-frequency jitter-sensitive circuitry, such as serializers and physical-layer transmitters.

While this specification contains many specifics, these should not be construed as limitations on the scope of any invention or of what may be claimed, but rather as descriptions of features specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Thus, particular embodiments have been described. Other embodiments are within the scope of the following claims.

What is claimed is:

1. A single photon avalanche diode (SPAD) device, comprising:
   a substrate doped to exhibit a first type conductivity and having a top substrate surface and a bottom substrate surface, the first type conductivity being either one of a n-type conductivity and an opposite p-type conductivity;
   a well region located in the substrate from the top substrate surface and doped to exhibit a second, opposite type conductivity to leave a substrate region of the first type conductivity in the substrate between the well region and the bottom substrate surface, wherein the bottom of the well region and the top of the substrate region interfaces to form a deep p-n junction;
   a trench ring formed in the well region to create a trench from the top substrate surface that surrounds a first portion of the well region and leave a second portion of the well region outside the trench ring, the trench ring filled with an insulator material to form a guard ring to spatially confine the first portion of the well region;
   a shallow region in the first portion of the well region inside the guard ring that is doped to exhibit the first type conductivity to have a depth from the top substrate surface less than a depth of the guard ring, a bottom part of the shallow region interfacing with a remaining of the first portion of the well region in the second type conductivity to form a shallow p-n junction; and
   a quenching resistive element electrically coupled to the shallow p-n junction to produce a large resistance that makes a voltage across the shallow p-n junction to be less than a breakdown voltage of the shallow p-n junction when the shallow p-n junction is electrically reversely biased to cause an avalanche breakdown process upon absorption of a photon in the shallow p-n junction; wherein
   the quenching resistive element comprises an active recharge circuit electrically coupled in series to the shallow p-n junction to control quenching and recharging the shallow p-n junction in the avalanche ionization process, the active recharge circuit comprising:
   a quenching transistor whose source or drain is electrically connected to the shallow p-n junction, the quenching transistor being electrically controlled to exhibit the large resistance;
   a recharge transistor whose source or drain is electrically connected to the shallow p-n junction, the recharge transistor being electrically controlled to exhibit a small resistance less than the large resistance; and
   a control circuit comprising a control transistor electrically coupled to the quenching transistor and the recharge transistor and operable in response to a sensing voltage at the shallow p-n junction to
   turn on the quenching transistor to supply the large resistance to the shallow p-n junction while turning off the recharge transistor when the sensing voltage is at a first level when the shallow p-n junction is in the avalanche breakdown process, and
   turn off the quenching transistor and turn on the recharge transistor to supply the small resistance to the shallow p-n junction when the sensing voltage is at a second level when the shallow p-n junction needs to be recharged.

2. The device as in claim 1, wherein:
the active recharge circuit is monolithically formed on the substrate.

3. The device as in claim 1, wherein:
the first type conductivity is the p-type conductivity and the second type conductivity is the n-type conductivity.

4. The device as in claim 1, wherein:
the first type conductivity is the n-type conductivity and the second type conductivity is the p-type conductivity.

5. The device as in claim 1, wherein:
the substrate is made of silicon and the insulator material is a silicon oxide.

6. The device as in claim 1, wherein:
the quenching resistive element is monolithically formed on the substrate.

7. The device as in claim 1, wherein:
the quenching resistive element is located outside the substrate.

8. The device as in claim 1, wherein:
the quenching resistive element comprises a resistor.

9. The device as in claim 1, wherein:
the quenching resistive element comprises a transistor whose source or drain is electrically connected to the shallow p-n junction in series.

10. The device as in claim 1, wherein:
the depth of the guard ring from the top substrate surface is less than a depth of the well region.

11. The device as in claim 1, comprising:
a detector circuit electrically coupled to bias the shallow region of the first type conductivity, the well region of the second type conductivity and the substrate region of the first type conductivity to bias the shallow p-n junction in a Geiger mode, and
wherein the detector circuit comprises a quenching resistive element electrically coupled to the shallow p-n junction to produce a large resistance that makes a voltage across the shallow p-n junction to be less than a breakdown voltage of the shallow p-n junction during an avalanche breakdown process caused by absorption of a photon in the shallow p-n junction.

12. The device as in claim 1, comprising:
a detector circuit electrically coupled to the shallow region of the first type conductivity, the well region of the second type conductivity and the substrate region of the first type conductivity to
bias the shallow p-n junction in a Geiger mode to detect light at a first wavelength, and
bias the deep p-n junction in a Geiger mode to detect light at a second wavelength that is shorter than the first wavelength for light entering the device from the top substrate surface.

13. The device as in claim 12, wherein:
the detector circuit comprises:
a first quenching resistive element electrically coupled in series to the shallow region of the second type conductivity of the shallow p-n junction to produce a first large resistance that makes a voltage across the shallow p-n junction to be less than a breakdown voltage of the shallow p-n junction during an avalanche breakdown process caused by absorption of a photon at the first wavelength in the shallow p-n junction; and a second quenching resistive element electrically coupled in series to the substrate region of the first type conductivity of the deep p-n junction to produce a second large resistance that makes a voltage across the deep p-n junction to be less than a breakdown voltage of the deep p-n junction during an avalanche breakdown process caused by absorption of a photon at the second wavelength in the deep p-n junction.

14. The device as in claim 13, wherein:
the detector circuit comprises:
  a first readout circuit electrically coupled to the shallow region of the first type conductivity to read out an output from the shallow p-n junction indicative of detected light at the first wavelength; and
  a second readout circuit electrically coupled to the substrate region of the first type conductivity to read out an output from the deep p-n junction indicative of detected light at the second wavelength.

15. The device as in claim 14, wherein:
the first readout circuit comprises:
  a first high-pass filter electrically connected in series to the shallow region of the first type conductivity; and
  a first voltage divider electrically connected to the first high-pass filter to produce a first readout signal; and
the second readout circuit comprises:
  a second high-pass filter electrically connected in series to the substrate region of the first type conductivity; and
  a second voltage divider electrically connected to the second high-pass filter to produce a second readout signal.

16. The device as in claim 1, comprising:
a second trench ring, separate from the trench ring, and formed at an outer boundary of the well region to create a second trench from the top substrate surface that surrounds the well region and is partially located in the substrate region of the first type conductivity in the substrate, wherein the second trench ring interfaces with the deep p-n junction to create a boundary of the deep p-n junction and the second trench ring is filled with an insulator material to form a second guard ring, wherein a depth of the second guard ring from the top substrate surface is greater than a depth of the well region.

17. A single photon avalanche diode (SPAD) device, comprising:
a substrate doped to exhibit a first type conductivity and having a top substrate surface and a bottom substrate surface, the first type conductivity being either one of a n-type conductivity and an opposite p-type conductivity;
a well region located in the substrate from the top substrate surface and doped to exhibit a second, opposite type conductivity to leave a substrate region of the first type conductivity in the substrate between the well region and the bottom substrate surface, wherein the bottom of the well region and the top of the substrate region interfaces to form a deep p-n junction;
a trench ring formed in the well region to create a trench from the top substrate surface that surrounds a first portion of the well region and leave a second portion of the well region outside the trench ring, the trench ring filled with an insulator material to form a guard ring to spatially confine the first portion of the well region;
a shallow region in the first portion of the well region inside the guard ring that is doped to exhibit the first type conductivity to have a depth from the top substrate surface less than a depth of the guard ring, a bottom part of the shallow region interfacing with a remaining of the first portion of the well region in the second type conductivity to form a shallow p-n junction; and
a detector circuit electrically coupled to the shallow region of the first type conductivity, the well region of the second type conductivity and the substrate region of the first type conductivity to
  bias the shallow p-n junction in a Geiger mode to detect light at a first wavelength, and
  bias the deep p-n junction in a Geiger mode to detect light at a second wavelength that is shorter than the first wavelength for light entering the device from the top substrate surface.

18. The device as in claim 17, wherein:
the detector circuit comprises:
  a first quenching resistive element electrically coupled in series to the shallow region of the second type conductivity of the shallow p-n junction to produce a first large resistance that makes a voltage across the shallow p-n junction to be less than a breakdown voltage of the shallow p-n junction during an avalanche breakdown process caused by absorption of a photon at the first wavelength in the shallow p-n junction; and
  a second quenching resistive element electrically coupled in series to the substrate region of the first type conductivity of the deep p-n junction to produce a second large resistance that makes a voltage across the deep p-n junction to be less than a breakdown voltage of the deep p-n junction during an avalanche breakdown process caused by absorption of a photon at the second wavelength in the deep p-n junction.

19. The device as in claim 18, wherein:
the detector circuit comprises:
  a first readout circuit electrically coupled to the shallow region of the first type conductivity to read out an output from the shallow p-n junction indicative of detected light at the first wavelength; and
  a second readout circuit electrically coupled to the substrate region of the first type conductivity to read out an output from the deep p-n junction indicative of detected light at the second wavelength.

20. The device as in claim 19, wherein:
the first readout circuit comprises:
  a first high-pass filter electrically connected in series to the shallow region of the first type conductivity; and
  a first voltage divider electrically connected to the first high-pass filter to produce a first readout signal; and
the second readout circuit comprises:
  a second high-pass filter electrically connected in series to the substrate region of the first type conductivity; and
  a second voltage divider electrically connected to the second high-pass filter to produce a second readout signal.

21. The device as in claim 17, wherein:
the first type conductivity is the p-type conductivity and the second type conductivity is the n-type conductivity.

22. The device as in claim 17, wherein:
the first type conductivity is the n-type conductivity and the second type conductivity is the p-type conductivity.

23. The device as in claim 17, wherein:
the substrate is made of silicon and the insulator material is a silicon oxide.

24. The device as in claim 17, wherein:
the quenching resistive element is monolithically formed on the substrate.

25. The device as in claim 17, wherein:
the quenching resistive element is located outside the substrate.

26. The device as in claim 17, wherein:
the quenching resistive element comprises a resistor.

27. The device as in claim 17, wherein:
the quenching resistive element comprises a transistor whose source or drain is electrically connected to the shallow p-n junction in series.

28. The device as in claim 17, wherein:
the depth of the guard ring from the top substrate surface is less than a depth of the well region.

29. The device as in claim 17, comprising:
a second trench ring, separate from the trench ring, and formed at an outer boundary of the well region to create a second trench from the top substrate surface that surrounds the well region and is partially located in the substrate region of the first type conductivity in the substrate, wherein the second trench ring interfaces with the deep p-n junction to create a boundary of the deep p-n junction and the second trench ring is filled with an insulator material to form a second guard ring, wherein a depth of the second guard ring from the top substrate surface is greater than a depth of the well region.

30. A single photon avalanche diode (SPAD) device, comprising:
a substrate doped to exhibit a first type conductivity and having a top substrate surface and a bottom substrate surface, the first type conductivity being either one of a n-type conductivity and an opposite p-type conductivity;
a well region located in the substrate from the top substrate surface and doped to exhibit a second, opposite type conductivity to leave a substrate region of the first type conductivity in the substrate between the well region and the bottom substrate surface, wherein the bottom of the well region and the top of the substrate region interfaces to form a deep p-n junction;
a trench ring formed at an outer boundary of the well region to create a trench from the top substrate surface that surrounds the well region and is partially located in the substrate region of the first type conductivity in the substrate, wherein a bottom of the trench ring interfaces with the deep p-n junction to create a boundary of the deep p-n junction and the trench ring is filled with an insulator material to form a guard ring;
a shallow region in the well region and spaced from the guard ring that is doped to exhibit the first type conductivity to have a depth from the top substrate surface less than a depth of the well region from the top substrate surface, a bottom part of the shallow region interfacing with a remaining of the well region in the second type conductivity to form a shallow p-n junction; and
a detector circuit electrically coupled to the shallow region of the first type conductivity, the well region of the second type conductivity and the substrate region of the first type conductivity to
bias the shallow p-n junction in a Geiger mode to detect light at a first wavelength, and
bias the deep p-n junction in a Geiger mode to detect light at a second wavelength that is shorter than the first wavelength for light entering the device from the top substrate surface.

31. The device as in claim 30, wherein:
the detector circuit comprises:
a first quenching resistive element electrically coupled in series to the shallow region of the second type conductivity of the shallow p-n junction to produce a first large resistance that makes a voltage across the shallow p-n junction to be less than a breakdown voltage of the shallow p-n junction during an avalanche breakdown process caused by absorption of a photon at the first wavelength in the shallow p-n junction; and
a second quenching resistive element electrically coupled in series to the substrate region of the first type conductivity of the deep p-n junction to produce a second large resistance that makes a voltage across the deep p-n junction to be less than a breakdown voltage of the deep p-n junction during an avalanche breakdown process caused by absorption of a photon at the second wavelength in the deep p-n junction.

32. The device as in claim 31, wherein:
the detector circuit comprises:
a first readout circuit electrically coupled to the shallow region of the first type conductivity to read out an output from the shallow p-n junction indicative of detected light at the first wavelength; and
a second readout circuit electrically coupled to the substrate region of the first type conductivity to read out an output from the deep p-n junction indicative of detected light at the second wavelength.

33. The device as in claim 32, wherein:
the first readout circuit comprises:
a first high-pass filter electrically connected in series to the shallow region of the first type conductivity; and
a first voltage divider electrically connected to the first high-pass filter to produce a first readout signal; and
the second readout circuit comprises:
a second high-pass filter electrically connected in series to the substrate region of the first type conductivity; and
a second voltage divider electrically connected to the second high-pass filter to produce a second readout signal.

34. The device as in claim 30, wherein:
the first type conductivity is the p-type conductivity and the second type conductivity is the n-type conductivity.

35. The device as in claim 30, wherein:
the first type conductivity is the n-type conductivity and the second type conductivity is the p-type conductivity.

36. The device as in claim 30, wherein:
the substrate is made of silicon and the insulator material is a silicon oxide.

37. The device as in claim 30, wherein:
the quenching resistive element is monolithically formed on the substrate.

38. The device as in claim 30, wherein:
the quenching resistive element is located outside the substrate.

39. The device as in claim 30, wherein:
the quenching resistive element comprises a resistor.

40. The device as in claim 30, wherein:
the quenching resistive element comprises a transistor whose source or drain is electrically connected to the shallow p-n junction in series.

41. The device as in claim 30, wherein:
the depth of the guard ring from the top substrate surface is less than a depth of the well region.

42. The device as in claim 30, comprising:
a second trench ring, separate from the trench ring, and formed at an outer boundary of the well region to create a second trench from the top substrate surface that surrounds the well region and is partially located in the substrate region of the first type conductivity in the substrate, wherein the second trench ring interfaces with the deep p-n junction to create a boundary of the deep p-n junction and the second trench ring is filled with an insulator material to form a second guard ring, wherein a depth of the second guard ring from the top substrate surface is greater than a depth of the well region.

* * * * *